US011342943B2

(12) United States Patent
Walters et al.

(10) Patent No.: US 11,342,943 B2
(45) Date of Patent: *May 24, 2022

(54) DATA ENCODING WITH ERROR-CORRECTING CODE PURSUANT TO COLORSPACE SCHEMES

(71) Applicant: Capital One Services, LLC, McLean, VA (US)

(72) Inventors: Austin Grant Walters, Savoy, IL (US); Jeremy Edward Goodsitt, Champaign, IL (US)

(73) Assignee: Capital One Services, LLC, McLean, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/896,528

(22) Filed: Jun. 9, 2020

(65) Prior Publication Data

US 2021/0126658 A1 Apr. 29, 2021

Related U.S. Application Data

(63) Continuation of application No. 16/663,984, filed on Oct. 25, 2019, now Pat. No. 10,715,183.

(51) Int. Cl.
*G06K 9/00* (2022.01)
*H03M 13/00* (2006.01)
*G06T 9/40* (2006.01)
*H03M 13/19* (2006.01)
*G06V 10/56* (2022.01)

(52) U.S. Cl.
CPC ............. *H03M 13/611* (2013.01); *G06T 9/40* (2013.01); *G06V 10/56* (2022.01); *H03M 13/19* (2013.01)

(58) Field of Classification Search
CPC .. H03M 13/611; H03M 13/19; G06K 9/4652; G06K 7/12–1495; G06T 9/40
See application file for complete search history.

(56) References Cited

U.S. PATENT DOCUMENTS 5,638,496 A 6/1997 Sato
5,818,032 A 10/1998 Sun et al.
(Continued)

FOREIGN PATENT DOCUMENTS

CN 206097730 U 4/2017
EP 0954801 A1 11/1999
(Continued)

OTHER PUBLICATIONS

International Search Report and Written Opinion for International Patent Application No. PCT/US2020/022815 dated Aug. 17, 2020, 20 pages.
(Continued)

*Primary Examiner* — Sean T Motsinger
(74) *Attorney, Agent, or Firm* — KDB Firm PLLC

(57) ABSTRACT

Techniques to improve storage, transmission and security of data are included. One or more methods, apparatuses, and articles of manufacture employ one or more color-channels, ultraviolet layers, infrared layers, and/or luminance layers to encode data on or along a physical medium, where the encoding includes utilizing one or more of those layers to encode an error-correcting code (ECC), such as a Hamming code with the data.

20 Claims, 14 Drawing Sheets

(56) References Cited

U.S. PATENT DOCUMENTS

| | | | |
|---|---|---|---|
| 5,992,748 A * | 11/1999 | Takahashi | G06K 7/12 235/462.04 |
| 6,070,805 A * | 6/2000 | Kaufman | G06K 7/14 235/462.04 |
| 6,119,943 A * | 9/2000 | Christy | G06K 1/121 235/462.04 |
| 6,354,502 B1 * | 3/2002 | Hagstrom | G06K 7/12 235/462.04 |
| 6,956,967 B2 | 10/2005 | Gindele et al. | |
| 6,985,252 B1 | 1/2006 | Kubo | |
| 7,170,645 B2 | 1/2007 | Kim et al. | |
| 7,180,629 B1 | 2/2007 | Nishio et al. | |
| 7,314,283 B2 | 1/2008 | Tsukada | |
| 7,327,875 B2 | 2/2008 | Sawada | |
| 8,483,479 B2 | 7/2013 | Kunkel et al. | |
| 8,665,347 B2 | 3/2014 | Miyawaki et al. | |
| 8,847,972 B2 | 9/2014 | Kane et al. | |
| 8,941,755 B2 | 1/2015 | Nikkanen | |
| 9,111,186 B2 * | 8/2015 | Blasinski | G06K 19/0614 |
| 9,230,326 B1 | 1/2016 | Liu | |
| 10,360,651 B1 | 7/2019 | Hoarty | |
| 10,496,862 B1 * | 12/2019 | Walters | G06T 5/40 |
| 10,496,909 B1 * | 12/2019 | Holman | G06K 19/06028 |
| 10,496,911 B1 * | 12/2019 | Walters | G06T 11/001 |
| 10,504,013 B1 * | 12/2019 | Walters | H04N 1/648 |
| 10,504,230 B1 * | 12/2019 | Stahl | G06K 19/06037 |
| 10,509,991 B1 * | 12/2019 | Walters | G06T 7/90 |
| 10,529,300 B1 * | 1/2020 | Walters | G09G 5/026 |
| 10,534,948 B1 | 1/2020 | Walters et al. | |
| 10,614,635 B1 | 4/2020 | Walters et al. | |
| 10,715,183 B1 * | 7/2020 | Walters | G06T 9/40 |
| 10,726,227 B1 | 7/2020 | Walters et al. | |
| 10,726,319 B1 | 7/2020 | Walters et al. | |
| 10,733,492 B1 | 8/2020 | Walters et al. | |
| 10,762,371 B1 | 9/2020 | Walters et al. | |
| 10,796,122 B1 | 10/2020 | Walters et al. | |
| 10,867,226 B1 | 12/2020 | Walters et al. | |
| 10,878,600 B1 | 12/2020 | Goodsitt et al. | |
| 10,944,914 B1 | 3/2021 | Le et al. | |
| 10,977,462 B2 | 4/2021 | Walters et al. | |
| 10,977,535 B2 | 4/2021 | Walters et al. | |
| 10,977,536 B2 | 4/2021 | Walters et al. | |
| 2003/0228016 A1 | 12/2003 | Shimada | |
| 2003/0228031 A1 * | 12/2003 | Rhoads | G11B 20/00181 382/100 |
| 2003/0235923 A1 | 12/2003 | Jurik et al. | |
| 2004/0117751 A1 * | 6/2004 | Shrowty | G06F 30/398 716/111 |
| 2004/0153649 A1 * | 8/2004 | Rhoads | G07D 7/004 713/176 |
| 2004/0182930 A1 * | 9/2004 | Nojiri | G06K 19/06131 235/462.04 |
| 2004/0246529 A1 * | 12/2004 | Pruden | G06K 1/121 358/3.28 |
| 2005/0069168 A1 | 3/2005 | Zarrabizadeh | |
| 2005/0092844 A1 | 5/2005 | Zhang et al. | |
| 2005/0128491 A1 | 6/2005 | Kubo | |
| 2005/0167505 A1 | 8/2005 | Kim et al. | |
| 2005/0169496 A1 * | 8/2005 | Perry | G06F 21/79 382/100 |
| 2006/0097062 A1 * | 5/2006 | Cheong | G06K 19/06037 235/494 |
| 2006/0098241 A1 * | 5/2006 | Cheong | G06K 19/06037 358/463 |
| 2007/0138286 A1 * | 6/2007 | Kamijoh | G06K 19/06037 235/462.04 |
| 2008/0151280 A1 | 6/2008 | Kamijo et al. | |
| 2010/0066874 A1 | 3/2010 | Ishiga | |
| 2010/0200658 A1 * | 8/2010 | Olmstead | G06K 7/10732 235/455 |
| 2011/0101088 A1 | 5/2011 | Marguerettaz et al. | |
| 2011/0127331 A1 | 6/2011 | Zhao et al. | |
| 2012/0208592 A1 * | 8/2012 | Davis | H04N 5/232945 455/556.1 |
| 2013/0092738 A1 * | 4/2013 | Blasinski | G06K 7/10821 235/462.04 |
| 2014/0027516 A1 | 1/2014 | Fushiki | |
| 2014/0270512 A1 * | 9/2014 | Mesh-Iliescu | H04N 19/136 382/166 |
| 2015/0156477 A1 | 6/2015 | Lee et al. | |
| 2016/0062612 A1 | 3/2016 | Chum et al. | |
| 2016/0104310 A1 | 4/2016 | Van Gorp et al. | |
| 2016/0148083 A1 | 5/2016 | Osborne et al. | |
| 2016/0148089 A1 * | 5/2016 | Boday | G06K 19/06187 235/493 |
| 2016/0292486 A1 * | 10/2016 | Prusik | G06K 19/06046 |
| 2017/0185880 A1 * | 6/2017 | Lin | G06K 19/06037 |
| 2017/0200035 A1 * | 7/2017 | Teraura | G06K 19/06037 |
| 2017/0229052 A1 | 8/2017 | Veernapu et al. | |
| 2017/0243041 A1 * | 8/2017 | Arce | G06K 19/06056 |
| 2017/0249712 A1 * | 8/2017 | Branscomb | G06Q 50/167 |
| 2017/0339430 A1 | 11/2017 | Kalevo | |
| 2017/0344776 A1 * | 11/2017 | Sharma | G06K 7/1443 |
| 2018/0350180 A1 * | 12/2018 | Onischuk | G07C 13/00 |
| 2018/0373950 A1 | 12/2018 | Gong | |
| 2019/0108618 A1 | 4/2019 | Hwang et al. | |
| 2019/0138867 A1 * | 5/2019 | Vander Aa | G06K 19/0614 |
| 2019/0205668 A1 | 7/2019 | Noda et al. | |
| 2019/0295712 A1 * | 9/2019 | Bommarito | G06K 9/6202 |
| 2019/0384955 A1 * | 12/2019 | Frieser | G07D 7/0032 |
| 2020/0226762 A1 | 7/2020 | Milovanovic et al. | |
| 2020/0302137 A1 | 9/2020 | Walters et al. | |
| 2020/0366893 A1 * | 11/2020 | Leleannec | H04N 19/119 |
| 2021/0035331 A1 | 2/2021 | Xie et al. | |
| 2021/0133522 A1 | 5/2021 | Shang et al. | |
| 2021/0158096 A1 | 5/2021 | Sinha | |
| 2021/0200501 A1 | 7/2021 | Stankoulov | |
| 2021/0200969 A1 | 7/2021 | Walters et al. | |
| 2021/0201098 A1 | 7/2021 | Walters et al. | |
| 2021/0201099 A1 | 7/2021 | Walters et al. | |
| 2021/0304389 A1 | 9/2021 | Li et al. | |

FOREIGN PATENT DOCUMENTS

| | | |
|---|---|---|
| JP | 2007287004 A | 11/2007 |
| WO | 0124106 A1 | 4/2001 |
| WO | 2009121605 A2 | 10/2009 |
| WO | 2014140893 A2 | 9/2014 |
| WO | 2018002944 A1 | 1/2018 |

OTHER PUBLICATIONS

International Search Report and Written Opinion for International Patent Application No. PCT/US2020/022811 dated Aug. 17, 2020, 19 pages.

International Search Report and Written Opinion for International Patent Application No. PCT/US2020/029778 dated Jul. 29, 2020, 16 pages.

Wang Yu-Mei et al., "Secured Graphic QR Code with Infrared Watermark", 2018 IEEE International Conference of Applied System Inventions (ICASI), pp. 690-693, Apr. 13, 2018.

Clark, "A TeleComputer", Computer Graphics Proceedings, Annual Conference Series, Siggraph, 26(2):19-23, Jul. 1, 1992.

International Search Report and Written Opinion for International Application No. PCT/US2020/027220 dated Jun. 18, 2020, 15 pages.

International Search Report and Written Opinion for International Application No. PCT /US2020/022946 dated Jun. 25, 2020, 11 pages.

International Search Report and Written Opinion for International Patent Application No. PCT/US2020/022920 dated Jul. 7, 2020, 11 pages.

Sudhakar, "Histogram Equalization", Published on Jul. 9, 2017. Retrieved from Internet URL: <https://towardsdatascience.com/>, 5 pages.

(56) References Cited

OTHER PUBLICATIONS

Baluja et al., "Task-specific color spaces and compression for machine-based object recognition", Technical Disclosure Commons (Year: 2019), 9 pages.

* cited by examiner

PRINTING SYSTEM 600A

700

> DECODING A PLURALITY OF DATA ASSOCIATED WITH A PHYSICAL MEDIUM OR TRANSMITTED ALONG TRANSMISSION MEDIUM AND ACCORDING TO A COLORSPACE, THE COLORSPACE INCLUDING I) ONE OR MORE COLOR CHANNELS, II) ONE OR BOTH OF AN ULTRAVIOLET AND AN INFRARED CHANNEL, AND III) A LUMINANCE CHANNEL, WHEREIN THE ENCODING INCLUDES AT LEAST ONE ERROR-CORRECTING-CODE (ECC) ENCODED IN AT LEAST ONE OF I) THE ONE OR MORE COLOR-CHANNELS, II) THE ULTRAVIOLET OR THE INFRARED CHANNEL, OR III) THE LUMINANCE CHANNEL, WHEREIN THE PLURALITY OF DATA IS DISTINCT FROM THE ECC.
> *710*

> CREATING A DIMENSIONAL-SPACE WITH AT LEAST SEVEN CHANNELS, THE DIMENSIONAL-SPACE INCLUDING A COLORSPACE WITH AT LEAST FOUR CHANNELS EACH ASSOCIATED WITH AT LEAST ONE COLOR, THE DIMENSIONAL-SPACE INCLUDES AT LEAST THREE ADDITIONAL CHANNELS, EACH DISTINCT FROM THE FOUR COLOR-CHANNELS, WHEREIN THE THREE ADDITIONAL CHANNELS INCLUDE I) AN ULTRAVIOLET CHANNEL, II) AN INFRARED CHANNEL, AND III) A LUMINANCE CHANNEL
> *810*

> ENCODING A DISTINCT PORTION OF A PLURALITY OF DATA IN AT LEAST ONE OF THE I) AT LEAST FOUR COLOR-CHANNELS OR II) AT LEAST ONE OF THE THREE ADDITIONAL CHANNELS
> *820*

> ENCODING A DISTINCT PORTION OF AN ERROR-CORRECTING-CODE (ECC) IN AT LEAST ONE OF THE I) AT LEAST FOUR COLOR-CHANNELS OR II) AT LEAST ONE OF THE THREE ADDITIONAL CHANNELS
> *830*

> COMBINING THE ENCODED PLURALITY OF DATA AND THE ENCODED ECC TO CREATE A DATA MESSAGE
> 840

*FIG. 8*

DATA ENCODING WITH ERROR-CORRECTING CODE PURSUANT TO COLORSPACE SCHEMES

CROSS-REFERENCE TO RELATED APPLICATIONS

This application is a continuation of U.S. patent application Ser. No. 16/663,984, entitled "DATA ENCODING WITH ERROR-CORRECTING CODE PURSUANT TO COLORSPACE SCHEMES" filed on Oct. 25, 2019. The contents of the aforementioned application are incorporated herein by reference in their entirety.

BACKGROUND

Since time immemorial, certain materials (e.g., paint, ink, and/or the like) have been used to memorialize scenes and/or objects into semi-permanent to permanent mediums. Computer technologies allow for digitization and detections of these images embedded on these mediums and have introduced image processing as a technical field. Detection of images and revealing information associated therewith constitutes at least one aspect of image processing and have applications in a number of cases.

It is with respect to these and other considerations that the present improvements have been needed.

SUMMARY

The following presents a simplified summary in order to provide a basic understanding of some novel embodiments described herein. This summary is not an extensive overview, and it is not intended to identify key/critical elements or to delineate the scope thereof. Its sole purpose is to present some concepts in a simplified form as a prelude to the more detailed description that is presented later.

One aspect of the present disclosure includes an apparatus for encoding data, including data, on a physical page pursuant to one or more colorspace schemes. The apparatus includes: The apparatus includes: a memory to store instructions, processing circuitry, coupled with the memory, operable to execute the instructions, that when executed, cause the processing circuitry to: receive a data set, compress the received data set into a compressed data-packet, encode the compressed data-packet according to a colorspace, where the encoding is suitable for printing on a physical medium, where the colorspace is associated with a plurality of colors, and where the compressed data-packet is represented by each of the plurality of colors, and instruct a printing device to print the encoded data on the physical medium, where each of the plurality of colors representing the compressed data-packet is printed on the physical medium.

Another aspect of the present disclosure includes an apparatus for encoding data on a physical page pursuant to one or more colorspace schemes. The apparatus includes: a memory to store instructions and processing circuitry, coupled with the memory, operable to execute the instructions, that when executed, cause the processing circuitry to: receive a data set, where in various embodiments the multimedia set may include least one of i) one or more text data, ii) one or more picture data, and iii) one or more video data, compress the received data set into a compressed data-packet, encode the compressed data-packet on one or more pages (e.g. a digital representation of material that can be subsequently printed by a printing device) according to a colorspace, where the colorspace is associated with a plurality of colors, and where the compressed data-packet is represented by each of the plurality of colors, and instruct a printing device to print the one or more pages on one or more physical pages, where each of the plurality of colors representing the compressed data-packet is printed on the one or more physical pages.

Another aspect of the present disclosure includes a method for scanning a page containing encoded data pursuant to one or more colorspaces and/or decoding the data from the page. The method includes: scanning one or more physical pages containing compressed data, where the compressed data is encoded on the one or more physical pages pursuant to a colorspace, where the colorspace is associated with a plurality of color-channels, where each one of the plurality of color-channels is associated with at least one color, and where the compressed data may represents a data set, where in various embodiments the data set may include at least one of i) one or more text data, ii) one or more picture data, and iii) one or more video data, and decoding the compressed data, where the decoding is pursuant to the colorspace.

Yet another aspect of the present disclosure includes an article of manufacture that contains one or more pieces of paper with encoded multimedia information thereon. The article of manufacture includes: a sheet of paper, a plurality of colors printed on the sheet of paper and based on a colorspace with six or more color-channels, each of the six or more color-channels containing at least one distinct color in relation to one another, and where each one of the at least one distinct colors is represented in the plurality of color, and at least one of an ultraviolet channel and an infrared channel represented and detectable by a pattern of ink on the sheet of paper, where the pattern of ink can absorb or reflect at least one ultraviolet light and infrared light, where each one of the plurality of colors represents at least one bit of data of a compressed data-packet, where the compressed data-packet represents a data set, where in various embodiments the data set may include at least one of i) one or more text data, ii) one or more picture data, and iii) one or more video data, where the at least one of the ultraviolet channel and the infrared channel represents an error correcting code in relation to the compressed data-packet, and where the sheet of paper contains at least one additional data representing the error correcting code.

Yet another aspect of the present disclosure includes an article of manufacture that contains one or more pieces of paper with encoded multimedia information thereon. The article of manufacture includes: a sheet of paper, a plurality of colors printed on the sheet of paper and based on a colorspace with six or more color-channels, each of the six or more color-channels containing at least one distinct color in relation to one another, and where each one of the at least one distinct colors is represented in the plurality of color, and at least one of an ultraviolet channel and an infrared channel represented and detectable by a pattern of ink on the sheet of paper, where the pattern of ink can absorb or reflect at least one ultraviolet light and infrared light, where each one of the plurality of colors represents at least one bit of data of a compressed data-packet, where the compressed data-packet represents a data set, where in various embodiments the data set may include at least one of i) one or more text data, ii) one or more picture data, and iii) one or more video data, where the at least one of the ultraviolet channel and the infrared channel represents an error correcting code in relation to the compressed data-packet, and where the sheet of paper may contain at least fifty mega-bytes of data in addition to data representing the error correcting code.

Yet another aspect of the present disclosure includes an apparatus for encoding and transmitting data pursuant to one or more colorspace schemes. The apparatus includes: a memory to store instructions and processing circuitry, coupled with the memory, operable to execute the instructions, that when executed, cause the processing circuitry to: receive a first colorspace, convert the first colorspace to a second colorspace, determine a first color-channel associated with a maximum of the second colorspace and a second color-channel associated with a minimum of the second colorspace, encrypt a plurality of messages on a signal for transmission along a transmission medium, where the encryption is based on a plurality of color-channels between the first color-channel and the second color-channel, and where the second colorspace determines a key for decrypting the encrypted plurality of messages, and transmit the signal along the transmission medium.

Yet another aspect of the present disclosure includes a method for decoding encoded data received along a transmission medium. The method includes: receiving an encrypted signal via a transmission medium at a receiving location associated with a transmission medium, where the encrypted signal contains data encrypted based on a conversion from a first colorspace to a second colorspace, where the first colorspace is a distinct type of colorspace in relation to the second colorspace, and where the second colorspace is associated with a plurality of color-channels, decrypting, by a computer processor, the received encrypted signal, where the decryption is based on a decryption cipher, and where the decryption cipher is based on the second colorspace, and storing the decrypted signal in a non-transitory storage component associated with the computer processor.

Yet another aspect of the present disclosure includes a non-transitory computer-readable storage medium storing computer-readable program code executable by a processor to: receive a plurality of data at a node of a fiberoptic transmission medium, encrypt a plurality of messages on a signal for transmission along the fiberoptic transmission medium based on a conversion between a first colorspace and a second colorspace, transmit the signal along the transmission medium, and provide a cipher for decrypting the encrypted plurality of messages at another node along the transmission medium, where the cipher is based on the conversion between the first colorspace and the second colorspace, and where the first colorspace is a different type of colorspace in relation to the second colorspace.

Yet another aspect of the present disclosure includes a non-transitory computer-readable storage medium for establishing error-correcting code on either as a transmission across a transmission line or in printable form on a printed medium. The apparatus includes: a memory to store instructions, and processing circuitry, coupled with the memory, operable to execute the instructions, that when executed, cause the processing circuitry to: encode a plurality of data on a physical medium or along transmission medium and according to a colorspace, the colorspace including i) one or more color-channels, ii) one or both of an ultraviolet channel and an infrared channel, and iii) a luminance channel, where the encoding includes at least one error-correcting-code (ECC) encoded in at least one of i) the one or more color-channels, ii) the ultraviolet or the infrared channel, or iii) the luminance channel, and where the plurality of data is distinct from the ECC. In various embodiments, where the encoding is pursuant to a printable medium, the encoding can include a quad-tree structure. In various embodiments, where the ECC is pursuant to a printable medium, a portion of the ECC can be associated with at least one color-channel of the one or more color-channels and/or with the luminance channel. In various embodiments, where the ECC is pursuant to a printable medium, the colorspace includes at least four color-channels, at least one ultraviolet channel and at least one infrared channel, and at least one luminance channel, and where the at least four color-channels includes only the plurality of data, and where the ECC is associated with all of the i) ultraviolet channel, ii) the infrared channel, and iii) the luminance, where in various embodiments the printable physical medium is a tag, where the one or more channels are part of at least two layers on the tag, where a first of the at least two layers is associated with the plurality of data, and where a second of the at least two layers is associated with the ECC. In various embodiments, where the ECC is along a transmission medium, the ECC is associated only with one or more color-channels of the encoding scheme. In various embodiments, whether the encoding scheme is to facilitate a transmission across a transmission line or as a printable medium, the ECC can be a Hamming code scheme.

Yet another aspect of the present disclosure includes a non-transitory computer-readable storage medium for establishing error-correcting code in relation to a transmission medium. The apparatus includes: encode a first portion of a plurality of data in at least one of four color-channels each associated with at least one color and pursuant to a colorspace, encode an error-correcting code (ECC) in each of the at least four-color-channels, distinct from the at least one color-channel associated with the first portion, encode a second portion of the plurality of data in at least one of i) an ultraviolet channel, ii) an infrared channel, and iii) a luminance channel, combine the first encoded portion, the second encoded portion, and the ECC to form a transmittable message, and transmit the combined message to a node associated with a transmission medium. In various embodiments the ECC can be a Hamming code and the transmission medium can be a fiberoptic cable.

Yet another aspect of the present disclosure includes a method for establishing an error-correcting code (ECC). The method can include: creating a dimensional-space with at least seven channels, the dimensional-space including a colorspace with at least four channels each associated with at least one color, the dimensional-space includes at least three additional channels, each distinct from the four color-channels, where the three additional channels include i) an ultraviolet channel, ii) an infrared channel, and iii) a luminance channel, encoding a distinct portion of a plurality of data in each one of i) at least one of the at least four color-channels and ii) at least one of the three additional channels, and encoding a distinct portion of an error-correcting-code (ECC) in at least of one of the at least four-color-channels. The method can further include: combining the encoded plurality of data and the encoded ECC to create a data message. The method can further include: transmitting the data message via a transmission medium, where in various embodiments, the transmission medium can be a fiber-optic cable, and where the ECC is a Hamming code. In various embodiments, the Hamming code can include at least three bits, and where each of the three bits is encoded on a distinct color-channel of the at least four color-channels, and where the plurality of data is at least partially contained in each one of the three additional channels. In various embodiments, the combined message can be printed on a surface in accordance with the dimensional space, where in various embodiments the ECC can be a Hamming code, and where the printing of the combined message can be in the form of a matrix-barcode. In various embodiments, the matrix bar-code can include at least one quad-tree structure, and where at least one bit of the Hamming code is encoded in the at least one quad-tree structure. In various embodiments, the Hamming code includes at least three bits, where a first bit of the Hamming code is encoded in the luminance channel. In various embodiments, a second bit of the Hamming code is encoded in the ultraviolet channel or the infrared channel, and in various embodiments, a third bit of the Hamming code is encoded in at least one of the ultraviolet channel, the infrared channel, or at least one of the at least four color-channels. In various embodiments, the combined message can be displayed on a computer screen as a matrix-barcode pursuant to the encoding associated with the dimensional space, where in various embodiments, the matrix-barcode includes at least one quad-tree structure, and where in various embodiments the Hamming code is encoded in the luminance channel associated with the quad-tree structure.

Yet another aspect of the present disclosure includes decoding data on a physical medium or transmitted along a transmission line. The method includes: decoding a plurality of data associated with a physical medium or transmitted along transmission medium and according to a colorspace, the colorspace including i) one or more color-channels, ii) one or both of an ultraviolet and an infrared channel, and iii) a luminance channel, where the encoding includes at least one error-correcting-code (ECC) encoded in at least one of i) the one or more color-channels, ii) the ultraviolet or the infrared channel, or iii) the luminance channel, where the plurality of data is distinct from the ECC. In various embodiments, where the plurality of data is on a physical medium, the method can further include: scanning the physical medium to decode the plurality of data associated with the colorspace, where in various embodiments the encoding of the plurality of data can be pursuant to a quad-tree structure, where in various embodiments the ECC is a Hamming code scheme. In various embodiments, the ECC can be associated with one or more color-channels. In various embodiments, the ECC can be associated with the luminance channel. In various embodiments, the colorspace can include at least four color-channels, at least one ultraviolet channel and at least one infrared channel, and at least one luminance channel, and where the at least four color-channels includes only the plurality of data, and where the ECC is associated with all of the i) ultraviolet channel, ii) the infrared channel, and iii) the luminance channel. In various embodiments, where the encoding is associated with transmitting data along a transmission line, the method can further include: receiving a signal containing the colorspace along a node of the transmission line, where in various embodiments the ECC is associated only with at least one color-channel of the one or more color-channels.

Yet another aspect of the present disclosure includes a scannable tag. The scannable tag includes: a first layer associated with an encoded plurality of data along one or more color-channels on the first layer, and a second layer associated with a Hamming Code, the Hamming code associated with all of an ultraviolet channel, an infrared channel, and a luminance channel, where the plurality of data is distinct from the ECC.

Yet another aspect of the present disclosure includes an article of manufacture. The article of manufacture includes: a printable surface and a matrix-barcode printed on the printable surface, the matrix barcode includes: a plurality of encoded data represented by at least one four color-channels, and an error-correcting code including at least three bits each represented distinctly by i) an ultraviolet layer, ii) a luminance channel and an iii) infrared layer

BRIEF DESCRIPTION OF THE DRAWINGS

FIG. 7 illustrates an embodiment of a first logic flow for one or more systems of the present disclosure, including FIG. 1A or FIG. 1B, and in accordance with at least one embodiment of the present disclosure.

FIG. 8 illustrates an embodiment of a second logic flow for one or more systems of the present disclosure, including FIG. 1A or FIG. 1B, and in accordance with at least one embodiment of the present disclosure.

DETAILED DESCRIPTION

Figure 1A:
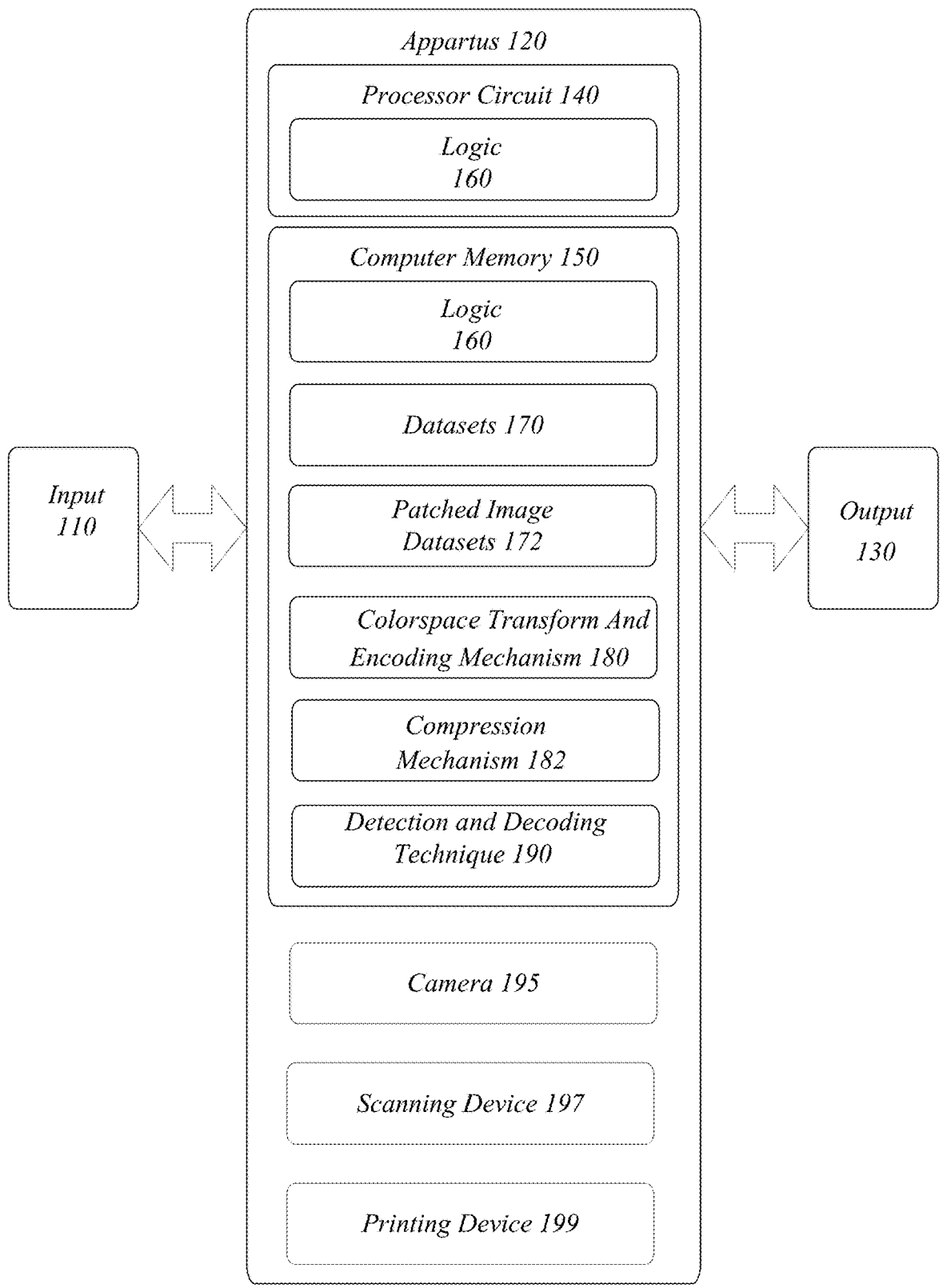
FIG. 1A illustrates an embodiment of a system to encode information or data onto one or more physical mediums, and to decode the information or data therefrom, in accordance with at least one embodiment of the present disclosure.

Various embodiments are directed to encoding data with an error-correcting code scheme along a transmission line and/or a printable medium. In various embodiments, by employing colorspace conversion and encoding techniques, in conjunction with the utilization of ultraviolet, infrared, and/or luminance schemes, the amount of data that can be securely encoded on the printable medium and/or along the transmission line can be increased, while additionally enhancing the accuracy, security and variability of the error-correcting scheme. Moreover, in various embodiments, utilization of the color-channels and/or ultraviolet and/or infrared and/or luminance channels can enhance detectability of more critical aspects of an encoded data combination that includes an ECC, e.g. channels with enhanced detectability can be encoded with the data and/or ECC depending on the particular application. Accordingly, various embodiments of the present disclosure enhance data storage capacity, detectability, and/or security associated with physical mediums containing or transmitting data.

In various embodiments, colorspace models are configured to represent color data, but most models differ in their representation of that color data. For instance, the CIELAB or LAB colorspace model represents color as three values: L for the Luminance/Lightness and Alpha (A) and Beta (B) for the green-red and blue-yellow color components, respectively. The LAB colorspace model is typically used when converting from a Red-Green-Blue (RGB) colorspace model into Cyan-Magenta-Yellow-Black (CMYK).

Depending on the application, one colorspace may be preferable for representing, printing and encoding, scanning and decoding, or storing information in relation to another colorspace, and in various embodiments, converting between colorspaces can be advantageous. In various embodiments, whether information is converted to an initial colorspace (e.g. represented by colors associated with color-channels representing bits of data), or whether information is initially converted to an initial colorspace and then subsequent colorspaces, each colorspace conversion will be associated with a mathematical description of the color-channels defining that colorspace, e.g. one or more equations or values (such as a tristimulus system in RGB or XYZ), where those mathematical relationships can serve both as a means of encoding and decoding data. Accordingly, various embodiments will use one or more variations of a theme of using at least one colorspace to encode and decode data, including data of any kind, where in one or more embodiments it can be multimedia data, e.g. video, audio, image, spatial data (which can create three-dimensional renderings), etc.

With general reference to notations and nomenclature used herein, the detailed descriptions which follow may be presented in terms of program procedures executed on a computer or network of computers. These procedural descriptions and representations are used by those skilled in the art to most effectively convey the substance of their work to others skilled in the art.

A procedure is here, and generally, conceived to be a self-consistent sequence of operations leading to a desired result. These operations are those requiring physical manipulations of physical quantities. Usually, though not necessarily, these quantities take the form of electrical, magnetic or optical signals capable of being stored, transferred, combined, compared, and otherwise manipulated. It proves convenient at times, principally for reasons of common usage, to refer to these signals as bits, values, elements, symbols, characters, terms, numbers, or the like. It should be noted, however, that all of these and similar terms are to be associated with the appropriate physical quantities and are merely convenient labels applied to those quantities.

Further, the manipulations performed are often referred to in terms, such as adding or comparing, which are commonly associated with mental operations performed by a human operator. No such capability of a human operator is necessary, or desirable in most cases, in any of the operations described herein which form part of one or more embodiments. Rather, the operations are machine operations. Useful machines for performing operations of various embodiments include general purpose digital computers or similar devices.

Various embodiments also relate to apparatus or systems for performing these operations. This apparatus may be specially constructed for the required purpose or it may comprise a general-purpose computer as selectively activated or reconfigured by a computer program stored in the computer. The procedures presented herein are not inherently related to a particular computer or other apparatus. Various general-purpose machines may be used with programs written in accordance with the teachings herein, or it may prove convenient to construct more specialized apparatus to perform the required method steps. The required structure for a variety of these machines may appear from the description given.

Reference is now made to the drawings, wherein like reference numerals are used to refer to like elements throughout. In the following description, for purposes of explanation, numerous specific details are set forth in order to provide a thorough understanding thereof. It may be evident, however, that the novel embodiments can be practiced without these specific details. In other instances, well-known structures and devices are shown in block diagram form to facilitate a description thereof. The intention is to cover all modifications, equivalents, and alternatives consistent with the claimed subject matter.

FIG. 1A illustrates a block diagram for a system 100A. Although the system 100 shown in FIG. 1A has a limited number of elements in a certain topology, it may be appreciated that the system 100 may include more or fewer elements in alternate topologies as desired for a given implementation. The system 100 may implement some or all of the structure and/or operations for the system 100 in a single computing entity, such as entirely within a single device.

The system 100 may comprise an apparatus 120. The apparatus 120 may be generally arranged to process input 110 using various components and generate output 130 of which (some) output 130 is displayed on a display device or printed on a suitable material surface. The apparatus 120 may comprise a processor 140 (e.g. processing circuit) and computer memory 150. The processing circuit 140 may be any type of logic circuit and the computer memory 150 may be a configuration of one or more memory units.

The apparatus 120 further includes logic 160 stored in the computer memory 150 and executed on the processing circuit 140. The logic 160 is operative to cause the processing circuit 140 to represent, e.g. encode, the datasets 170 (which can be any kind of data), but in one or more embodiments datasets 170 are datasets 170, e.g. video, audio, image, spatial data (which can create three-dimensional renderings), etc. as a patched image data 172, e.g. where the patched image data 172 is being configured in accordance with a colorspace model, and where the patched image data may define an area, e.g. a predefined number of pixels on a physical material, for encoding the data on the physical material. The colorspace model as described herein refers to any suitable colorspace model, such as Red-Green-Blue (RGB), Cyan-Magenta-Yellow-Black (CMYK), Luminance-Alpha-Beta (LAB), XYZ, and/or the like, where each channel in the model can represent a bit of data. For example, the Alpha and Beta channels of the LAB colorspace model refer to green-red and blue-yellow color components, respectively. The green-red component may represent a variance between red and green with green in the negative direction and red in the positive direction along an axis and the blue-yellow component may represent a variance between blue and yellow with blue in the negative direction and yellow in the positive direction along an axis. In various embodiments, a predefined range of values associated with each color-channel may represent a first bit value, e.g. "1," and a second range of values may represent a second bit value, e.g. a "0," from an encoding scheme perspective. As such, as the number of color-channels is increased, the overall encoding capacity may increase as well.

In various embodiments, the logic 160 is further operative to cause the processing circuit 140 to apply an encoding and colorspace transform mechanism 180 to the data set 170, which, as stated, can include one or more multimedia data, e.g. sound data, video data, audio data, image data, spatial data (which can create three-dimensional renderings), etc., in order to create an encoding scheme of patched image data 172 representing the data set 170, where the scheme may be printable on a physical material, such as a piece of paper. The patched image data may include a plurality of patches of which each patch comprises color data (e.g., pixel data where each pixel is represented as a tuple of Red-Green-Blue (RGB) color intensities, a tuple of XYZ color intensities, a tuple pursuant to a LAB scheme, or any other suitable color scheme). In various embodiments, and as alluded to above and below, a defined area of pixels will represent one or more bits of data, e.g. if a color associated with a color-channel exceeds a certain value in relation to the range of values of a color-channel, it then can be a "1" and if it is below a certain threshold value in relation to the range of values of that color-channel then the value can be a "0."

In various embodiments, a color-channel is a distribution of colors with a first color and second color of first and second highest prevalence, respectively, where the first color becomes a minimum in the color-channel and the second color becomes the maximum such that the boundary may be a transition between these colors. This boundary may be at least one pixel where the color changed from the first to the second color or vice versa. If the first color is set to zero (0) and the second color is set to two hundred and fifty-five (255), then, mathematically, this boundary may be located at pixel(s) that jumped between the minimum and maximum value; for example, there may be sharp division (i.e., thin boundary) in which at least two neighboring pixels transition immediately between 0 and 255. In various embodiments, as alluded to above, a range of values within a color-channel may constitute a bit value of "1," e.g. 128-255, and a range of values within a color-channel may constitute a bit value of "0", e.g. 0-127. In various embodiments, color-channels, e.g., "R," "G," and "B" define a colorspace such as RGB (e.g., a first colorspace based on a tristimulus system), and in various embodiments custom color-channels can be created using a (second) tristimulus system associated with and defining an XYZ (second, e.g. converted-to, colorspace).

In various embodiments, the encoding can be based on multiple colorspace conversions, where a second conversion may be done to enhance edge-detection of the printed scheme on the paper (e.g. converting from one colorspace to another in order to enhance detection based on a color scheme of the environment that will be associated with the scan) and/or as an additional layer of security with respect to the encoding. In various embodiments, the color-channels may be greater than three, e.g. colors that are imperceptible to the human eye can be used provided a suitable printer, e.g. printing device 199, and a suitable scanner, e.g. 197, are utilized to print and scan, respectively, the patched image data 172 corresponding to encoded scheme for the datasets 170 (e.g. video data, audio data, image data, spatial data (which can create three-dimensional renderings), etc.). Moreover, in various embodiments, in order to improve edge detection, as discussed herein, one or more color-channel ranges are selected such that a maximum color value of one or more color-channel corresponds to a unique color value, most prevalent color value, and/or highest color value of an environment associated with a scan and decoding of printed material corresponding to encoded data, such as the patched image data 172 printed on a physical medium, e.g. physical tape, paper, and/or any other material suitable for printing ink or suitable substance thereon, and the minimum color value of the color-channel corresponds to a most unique color, most prevalent color value and/or highest color value of the printed material, where additionally, the most prevalent value and/or highest color value of the printed material is also a least prevalent (lowest color value) and/or absent from the target object, entity, and/or environment associated with the scan, or visa-versa (e.g. with respect to the maximum or minimum values).

In various embodiments, as described herein, one colorspace model (e.g. XYZ) may correspond to a higher likelihood of success in edge detection than another colorspace model given a particular environment and/or physical material used for the encoding scheme. Some images provide optimal or near-optimal edge detection results when arranged in RGB while other images provide optimal or near-optimal edge detection results when arranged in LAB or an XYZ colorspace and vice versa. Accordingly, in various embodiments, the colorspace and associated colors selected for the encoding scheme of the dataset 170 can be selected with optimization of detection and scanning in mind.

In various embodiments, the logic 160 is further operative to cause the processing circuit 140 to apply the colorspace transform and encoding mechanism 180 to the data 170 to generate the patched image data 172, and then instruct a suitable printing device, e.g. printing device 199, to print the patched image data 172 on a physical medium, such as a physical page, piece of paper, tape, or any other suitable medium. In various embodiments, the logic is further operative to cause the processing circuit to instruct a scanning device, such as scanning device 197, to scan and decode the patched image data 172 to obtain the data 170. The encoding and decoding can be based on the key or mathematical relationship defining the relevant colors and color-channels of the colorspace and associated with one or more colorspace conversions. For example, if the colorspace scheme associated with the image is an XYZ colorspace, then one or more color-channels of the XYZ colorspace are defined by a tristimulus scheme, that includes at least one chromacity value, e.g. "x", and at least one luminance value, e.g. "y":

$$x=X/(X+Y+Z),$$

$$y=Y/(X+Y+Z),$$

$$z=Z/(X+Y+Z). \qquad \text{Equation 1}$$

This means that one or more color-channels are defined by the above equation and can be used to create one or more color-channels in the XYZ colorspace, including colors and color-channels imperceptible to the human eye.

In various embodiments, the encoding may be such that x, y, and z may have certain values that define the particular color-channels associated with the space, and pre-defined color range values within the channel may determine whether the channel represents a "1" or a "0" value. Without knowing the initial x, y, and z values of the various color-channels, decoding the encoded data may not be possible, and this feature can be amplified, in various embodiments, by having the printing device 199 print colors that are not associated with the color-channels defined by one or more iterations of Equation 1 or any other suitable colorspace defining scheme. Accordingly, the equations governing the particular colorspace, of which the above is one example and for one colorspace conversion or conversions, provide the basis for encoding the image data 172 onto a physical medium, and also the basis for decoding the data 170 from the image data 172, as the suitable scanner, e.g. scanning device 197, can be configured to decode the information by having access to the mathematical relationship or key, e.g. Equation 1, defining the colorspace.

In various embodiments, prior to performing any encoding operation, a compression mechanism can apply any suitable compression technique to the data 170 to reduce its size and increase the amount of data that can be represented and/or encoded as a result of the conversion associated with patched image data 172. In various embodiments, where the data is multimedia data for example, any suitable compression technique can be applied to the multimedia data 170 prior to the conversion, e.g. any suitable compression per an MPEG® scheme (such as H.264), VPEG® scheme, or any other suitable scheme can be used.

In various embodiments, and as discussed in more detail with respect to one or more embodiments provided below, if the initial or subsequent (in instances where multiple colorspaces and conversions thereto or therefrom are used) colorspace has a luminance factor, such as an XYZ colorspace, the luminance factor can be temporarily filtered out when determining the various chromacity values desired for use with the image data 172.

In various embodiments, the luminance factor, e.g. "y" of Equation 1, can be reintroduced (or used from the outset if it was never filtered out), to define tangential information related to the data 170, such as metadata, an error correcting code, e.g. Hamming code, and/or page orientation information. Accordingly, in various embodiments, logic 160 may be further operative to cause the processing circuit 140 to cause the image data set 172 to associate particular data distinct from the data 172 in relation to the luminance value of a colorspace and for a defined area; and as such, instruct the printing device to define an area with a factor of magnitude larger than the encoded data area defined by pixels associated with the image data for the purpose of having encoding luminance channel information. In various embodiments, the area defining the luminance value is a factor of magnitude larger than an area with just pixels carrying the encoded color scheme because of the higher error rate associated with scanning information associated with brightness values. Irrespective of the size of the area defined by the encoded luminance value, a range of brightness values correspond to a "1" bit value (brightness higher than or equal to a certain value) and a range of values correspond to a "0" bit value (brightness less than a certain value).

In various embodiments, the patched image data 172 can provide for a scheme that includes at least one infrared layer and at least one ultraviolet layer, in addition to colors associated with one or more color-channels. In various embodiments, the logic may be further operated to cause the processing circuitry 140 to instruct a printing device, e.g. printing device 199, to print the patched image data 172 on a physical medium, such as a physical page, a piece of paper, physical tape, or any other suitable medium with one or more inks reflecting one of or both of the ultraviolet light and infrared light on top, and inks associated with one or more color-channels below. In various embodiments, the ultraviolet layer is on top of both the infrared layers and the color-channel layers. In various embodiments, the presence or absence of ultraviolet layer constitutes a bit of data, e.g. a value of "1" if ultraviolet light is reflected and a value of "0" if it is absorbed or otherwise not reflected, and the presence or absence of an infrared layers constitutes a bit of data, e.g. a value of "1" if ultraviolet light is reflected and a value of "0" if it is absorbed or otherwise not reflected. In various embodiments, as discussed below, a detection and decoding technique 190 can be configured to consider the presence or absence of ultraviolet and/or infrared light as indicative of a bit of data.

In various embodiments, when printing an encoded data set with an ECC, such as a Hamming Code, one or more pixels associated with one or more color-channels, one or more ultraviolet layers, one or more infrared layers can be encoded with data (e.g. multimedia data, informational data, etc.) and/or with a portion of the ECC. In various embodiments, at least one bit of data and/or ECC portions are represented by any one of the one or more color-channels, one or more ultraviolet layers, one or more infrared layers, and/or one or more luminance channel. In various embodiments, and as alluded to above and below, a defined area of pixels will represent one or more bits of data, e.g. if a color associated with a color-channel exceeds a certain value in relation to the range of values of a color-channel, it then can be a "1" and if it is below a certain threshold value in relation to the range of values of that color-channel then the value can be a "0," where the threshold scheme can be used for the data portion and ECC portion of a combined information set, message, or data entity as encoded on the printed medium. In various embodiments, the presence or absence of ultraviolet layer constitutes a bit of data, e.g. a value of "1" if ultraviolet light is reflected and a value of "0" if it is absorbed or otherwise not reflected with respect to either one of the data portion or ECC portion of the message, and similarly the presence or absence of an infrared layers constitutes a bit of data, e.g. a value of "1" if infrared light is reflected and a value of "0" if it is absorbed or otherwise not reflected with respect to either one of the data portion or ECC portion of the message as printed on the medium. In various embodiments, an intensity level of either or both of the ultraviolet or infrared layers may be used to obtain a value of "1" and/or "0," or a threshold with respect to the ultraviolet or infrared spectrums can be used. In various embodiments, the presence or absence of a luminance layer constitutes a bit of data, e.g. a value of "1" if a certain threshold of luminance intensity is exceeded and a "0" if it is below that value.

In various embodiments, the logic 160 is operative to cause the processing circuit 140 to create a first data set as part of the patched image data 172. The first data set can include any suitable data, e.g. informational, multimedia, etc. and it can be encoded pursuant to a color-channel scheme with at least four-color-channels, where the four-color-channels may or may not be optimized for detection as discussed herein. In various embodiments, the logic 160 is operative to cause the processing circuit 140 to create a second data set as part of the patched image data 172, where the second dataset is representative of an ECC with a bit of ECC data distributed to each one of an ultraviolet channel, an infrared channel and a luminance channel. Accordingly, in various embodiments, a first data set includes four bits of data, with each bit being distributed or represented by a distinct one of the four color-channels, and three bits being represented distinctly by each one of the ultraviolet channel, the ultraviolet channel, and the luminance channel. In various embodiments, variations of the distribution of the first data set and the second data set are represented by any combination of color-channels and luminance, ultraviolet and infrared channels. In various embodiments, the logic 160 is operative to cause the processing circuit 140 to combine the first data set and the second data set and instruct the printing device 199 to print a scheme on a physical medium, e.g. paper, that includes patched data 172 pursuant to the data combination. In various embodiments, including at least one bit of the ECC in the luminance channel and the remaining bits of the first data set and second data set in various combinations of the four color-channels, the ultraviolet layer, and the luminance channel increases the overall detectability of the first data set and second data set by ensuring that the first data is contained in color-channels optimized for detection, while also preserving the detectability of the ECC without compensating for data density, as the luminance channel is more easily detectable on a physical medium. In various embodiments, this advantage can be further amplified by having the first data set encoded on each of the at least four color-channels, and the ECC encoded on each of the luminance channel, the ultraviolet channel, and the infrared channel. Accordingly, in various embodiments, four bits of data and three bits of ECC are encoded on a combination of at least four color-channels, an infrared channel, an ultraviolet channel, and a luminance channel.

In various embodiments, the encoding on the physical medium can be in the form of a matrix bar-code. In various embodiments, whether a matrix barcode is employed or not, the encoding on the physical medium can be pursuant to a quad-tree structure. In various embodiments, this means that a single bit of data can be pursuant to four separate sections of the same type of channel with respect to the quad-tree, which can enhance detection. For example, if a luminance channel is used, which can be prone to detection errors, by having a four by four portion of pixels with respect to the quad-tree representing the particular bit of data, e.g. a bit of ECC, the detection of that particular bit (and all other bits as encoded in the quad-tree) is enhanced.

In various embodiments, once encoding (and if applicable, compression) takes place, the logic 160 may be further operative to cause the processing circuit 140 to scan the physical medium containing the patched image data, e.g. using a suitable scanning device 197, apply an detection and decoding technique 190 to the patched image data 172 (as represented on a suitable physical medium, such as paper) and to decode the data 170 as represented by the patched image data 172. The edge detection technique of the detection and decoding technique 190 is an image processing technique that refers to any one of a number of algorithms for identifying edges or boundaries of objects within images. In general, the edge detection technique of the detection and decoding technique 190 provides information (e.g., pixel data) indicating positions of edges in the image data of the image datasets 170; and in various embodiments, the decoding scheme of the detection and decoding scheme 190 determines what color-channels contain relevant information based on the mathematical relationships defining the colorspace or colorspaces associated with the patched image data 172, and may also determine the bit value of those color-channels based on the color values associated therewith, e.g. the value of a particular color in the range of values associated with a particular color-channel.

Accordingly, in various embodiments, the data set 170 as encoded into an encoded data packet on one or more physical mediums, including pieces of paper, and pursuant to one or more colorspace conversions and/or utilizing one or more ultraviolet and infrared layers, and as may be associated with patched image data 172, may be decoded by one or more components of system 100 pursuant to a key defining the one or more colorspaces associated with encoding. In various embodiments, when compression is done prior to encoding, the encoded data packet may be decompressed prior to the decoding using any suitable decompression technique that serves as a counterpart to the encoding.

Some implementations of the edge detection technique of the detection and decoding technique 190 operate by detecting discontinuities in brightness and, for those implementations, having the image data, e.g. patched image data 172, in a LAB colorspace, or XYZ colorspace over RGB provides more precise edge detection results. Some implementations of the edge detection technique of the detection and decoding technique 190 provide accurate edge detection results when the image data is modeled according to HCL (Hue-Chroma-Luminance) instead of RGB and/or, as stated above and below, when converting from RGB to another colorspace, such as XYZ.

In various embodiments, the logic 160 is further operative to cause the processing circuit 140 to identify which colorspace model to use in transforming a given image prior to edge detection to achieve near-optimal edge detection results, e.g. optimizing the patched image data 172 for detection. The logic 160 is further configured to cause the processing circuit 140 to apply the colorspace and encoding transform mechanism 182 to transform the image data 172 from one colorspace containing the encoded version of the data 170, e.g. part of image data set 172, into transformed image data in accordance with another colorspace model (e.g. XYZ), e.g. another part of image data set 172, where the other or second colorspace model has a higher likelihood than the first colorspace model at edge detection for the final encoded image group. It is appreciated that the other colorspace model may be any colorspace model including those with a different number of channels than the colorspace model.

In various embodiments, the logic 160 can be further operative to cause the processing circuit 140 to apply the colorspace and encoding transform mechanism 182 to determine a colorspace that is optimal for detection in association with a particular environment where a scan of the printed version of the patched image data set 172 takes place. In various embodiments, a colorspace or histogram representation of the environment can be part of the image datasets 170. The logic 160 can be further operative to cause the processing circuit 140 to determine the optimal colorspace based on one or more colorspace conversion operations (where on example is provided in greater detail with reference to FIG. 2B). In various embodiments, a printed scheme according to one or more colorspaces may be provided for the patched image dataset 172 without first considering the colors of the environment where the scan may take place, in which case, the colorspace representation and associated colors of the environment where the scan takes place can be adjusted in relation to the printed patched image data 172 to optimize edge detection.

The one or more colorspace models as described herein, as stated and implied elsewhere herein, refers to any suitable colorspace model, such as colorspace employing a tristimulus system or scheme, the Red-Green-Blue (RGB), the Luminance-Alpha-Beta (LAB), an XYZ colorspace, and/or the like and/or variations of the same. Similarly, although various embodiments may refer to a particular conversion from one specific colorspace to another specific colorspace, conversions between other colorspaces are contemplated and consistent with the teachings of the present disclosure.

In various embodiments, as described herein, one colorspace model (e.g., RGB or XYZ) may correspond to a higher likelihood of success in edge detection than another colorspace model in terms of detection of a displayed or printed image, e.g. an encoded representation of data 170 in the form of patched image data 172, in relation to an environment with a particular color distribution. Moreover, particular colors and color-channels associated with a colorspace may offer superior edge detection in relation to the object, entity, or environment. Some images provide optimal or near-optimal edge detection results when arranged in RGB while other images provide optimal or near-optimal edge detection results when arranged in XYZ or LAB and vice versa. By way of example, an image depicting a red balloon on a green field may appear much different in RGB than in LAB; therefore, with respect to edge detection, LAB may provide a higher likelihood than RGB at successfully identifying and locating edges (e.g., boundaries) of the red balloon, or a printed encoded multimedia scheme, e.g. as represented by patched image data 172, that had a red color in the green environment.

In various embodiments, the system 100A can include one or more of a camera or video device 195, where both device 195 and device 197 can be any suitable device for obtaining, capturing, editing, and/or scanning images, including but not limited to video or camera pictures, of objects, entities, and/or environments. The logic 160 can be configured to capture or scan images of a particular object, entity or environment using device 195 and/or device 197, where the captured images can become part of image datasets 172 and used for determining suitable colorspaces, performing colorspace conversions, and/or scanning images determined from colorspace conversions, as may be consistent with the teachings provided herein, including selecting an optimal colorspace for an encoded multimedia scheme and/or an environment associated with the scanning thereof.

Figure 1B:
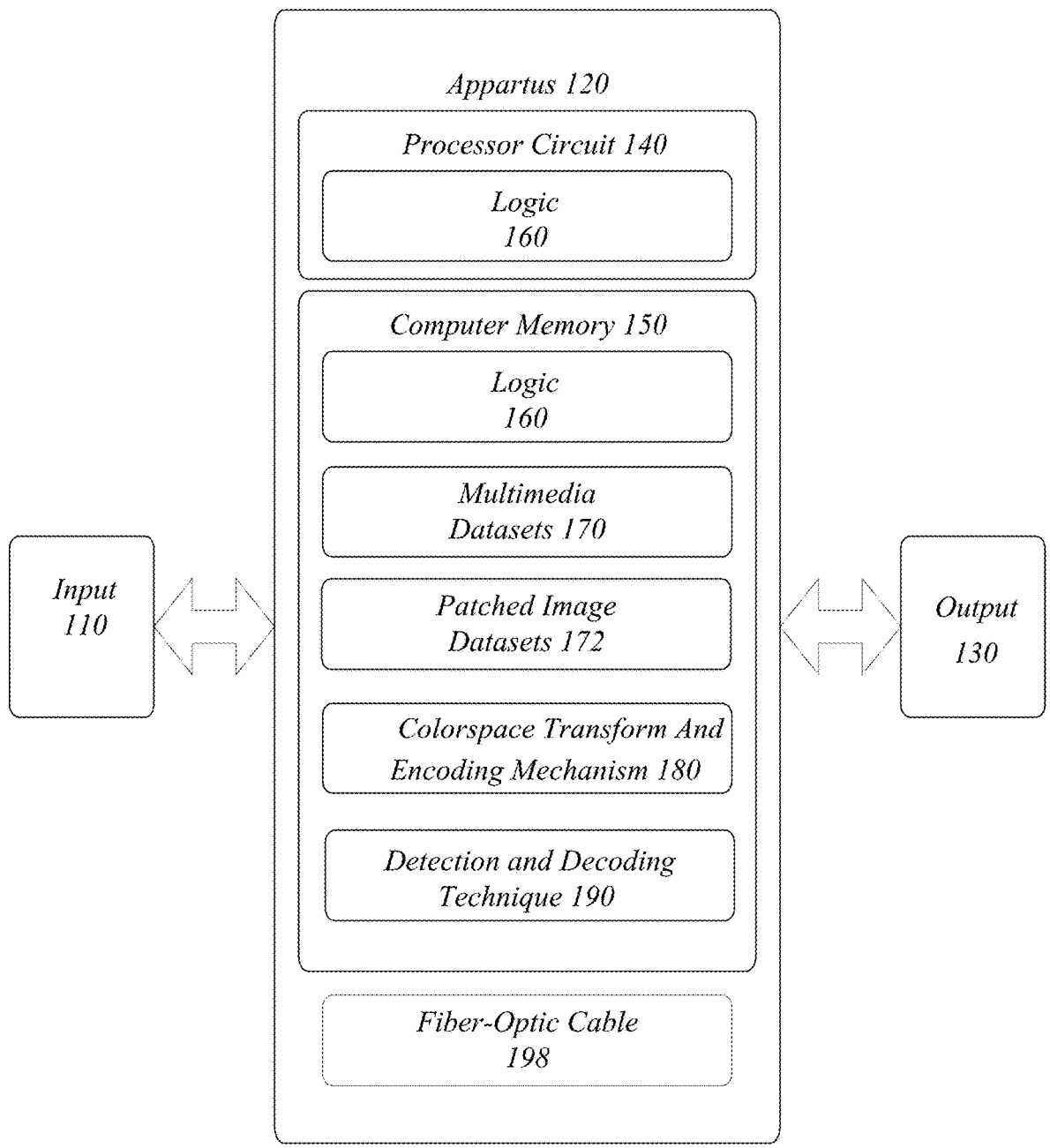
FIG. 1B illustrates an embodiment of a system to encode, transmit, and/or decode data along a transmission medium, and in accordance with at least one embodiment of the present disclosure.

FIG. 1B illustrates a block diagram for a system 100B. Although the system 100 shown in FIG. 1B has a limited number of elements in a certain topology, it may be appreciated that the system 100 may include more or fewer elements in alternate topologies as desired for a given implementation. The system 100 may implement some or all of the structure and/or operations for the system 100 in a single computing entity, such as entirely within a single device. Various components of system 100B are substantially similar to the components of system 100A.

The system 100B may comprise an apparatus 120. The apparatus 120 may be generally arranged to process input 110 at one node of a transmission medium (shown in greater detail with respect to FIG. 5A and FIG. 5B), such as a fiberoptic transmitter or receiver, using various components and generate (some) output 130 at another node along the transmission medium (shown in greater detail with respect to FIG. 5A and FIG. 5B), such as another fiberoptic transmitter or receiver. The apparatus 120 may comprise a processor 140 (e.g. processing circuit) and computer memory 150. The processing circuit 140 may be any type of logic circuit and the computer memory 150 may be a configuration of one or more memory units.

The apparatus 120 further includes logic 160 stored in the computer memory 150 and executed on the processing circuit 140. The logic 160 is operative to cause the processing circuit 140 to represent, e.g. encode, one or more datasets 172 (received as an input at 110 and stored in memory 150) pursuant to one or more colorspaces and/or colorspace conversions using a colorspace transform and encoding mechanism 180 resulting in encoded datasets 182. In various embodiments, the logic 160 is operative to process and/or receive the one or more datasets 172 as color data at input 110, e.g. process color data received at a transmission medium receiver or transmitted, e.g. a fiberoptic receiver or transmitter, based on the colorspace defining the received data. In various embodiments the logic is operative to receive the one or more datasets 172 as non-color data at input 110 and convert data represented by electrical signals into light signals, where the light signals may represent the data pursuant to a colorspace, and subsequently pursuant to one or more colorspace conversions.

In various embodiments, the logic 160 is further operative to cause the processing circuit 140 to apply a colorspace transform and encoding mechanism 180 to one or more datasets 172, e.g. financial data or information, data or information, security data or information, or any other data or information that may be suitable for transmission, where datasets 172 may be received as an input at 110 (and stored in memory 150) along a node, e.g. a receiver or transmitter, of a transmission medium, such as a fiber-optic cable. In various embodiments, the colorspace transform and encoding mechanism 180 may process or receive datasets 172 at input 110 according to light signals representing a first colorspace and represented by color-channels associated therewith, e.g. an RGB colorspace, and may convert the first colorspace to a second colorspace, e.g. LAB or XYZ, in order to transform the datasets 172 into encoded (or encrypted) datasets 182, e.g. an encoding takes place based on a converting from a first colorspace to a second colorspace that is different than the first colorspace, and where the conversion to the second colorspace defines the encoding scheme. In various embodiments, the mathematical definition of the second colorspace defines the encoding or encryption scheme in whole or in part, where one or more color-channels of the second colorspace contains provides for and contains the encoded data as one or more light signals transmitted along a fiberoptic line or cable. In various embodiments, more than colorspace conversion and to multiple different colorspaces may take place, where each conversion may (but need not) represent a layer of encryption defined by the mathematical definition of the converted-to colorspace or colorspaces.

In various embodiments, as stated above, the logic 160 may be configured to cause processor 140 to convert datasets 172 from electrical signals into light signals at an input 110, e.g. a fiberoptic transmitter and receiver, where the fiberoptic transmitter or receiver may convert the data according to a colorspace scheme, e.g. RGB channels of an RGB colorspace, and where the colorspace transform mechanism 180 may convert that first colorspace into a second and different colorspace and, in various embodiments, the second colorspace into a third and different colorspace, etc. In various embodiments, whether the datasets 172 were received as electrical signals and converted into light signals with one or more colorspace conversions were performed in association therewith or whether the data were received as light signals with one or more colorspace conversions performed in association therewith, the encoding and colorspace transform mechanism 180 provides for an encoding scheme for compressing and encoding the datasets 172 in a suitable manner for transmission via a transmission medium, such as fiber optic cable.

In various embodiment, one or more colorspace models, and as may be related to one or more colorspace conversions, as described herein may refer to any suitable colorspace model, such as Red-Green-Blue (RGB), Cyan-Magenta-Yellow-Black (CMYK), Luminance-Alpha-Beta (LAB), XYZ, and/or the like, where each channel in the model can represent a bit of data. For example, the Alpha and Beta channels of the LAB colorspace model refer to green-red and blue-yellow color components, respectively. The green-red component may represent a variance between red and green with green in the negative direction and red in the positive direction along an axis and the blue-yellow component may represent a variance between blue and yellow with blue in the negative direction and yellow in the positive direction along an axis. In various embodiments, a predefined range of values associated with each color-channel, e.g. a color value of a color associated with the color-channel, may represent a first bit value, e.g. "1," and a second range of values may represent a second bit value, e.g. a "0," from an encoding scheme perspective. As such, as the number of color-channels is increased, the overall encoding capacity may increase as well.

In various embodiments, a colorspace is associated with one or more color-channels, with various examples of color-channels in relation to individual colorspaces being provided for above and elsewhere herein. In various embodiments, a color-channel is a distribution of colors with a first color and second color of first and second highest prevalence, respectively, where the first color becomes a minimum in the color-channel and the second color becomes the maximum such that the boundary may be a transition between these colors, where this minimum and maximum scheme may be with respect to a colorspace that is converted thereto from another colorspace, e.g. a second colorspace part of a colorspace conversion from a first colorspace. This boundary may be at least one pixel where the color changed from the first to the second color or vice versa. If the first color is set to zero (0) and the second color is set to two hundred and fifty-five (255), then, mathematically, this boundary may be located at pixel(s), light components, or other physical manifestations reflecting of values that jumped between the minimum and maximum color value; for example, there may be sharp division (i.e., thin boundary) in which at least two (or portions of) light-signal representations, or other physical manifestations reflecting the light transition immediately between 0 and 255. In various embodiments, as alluded to above, a range of values within a color-channel may constitute a bit value of "1," e.g. 128-255, and a range of values within a color-channel may constitute a bit value of "0", e.g. 0-127. In various embodiments, color-channels, e.g., "R," "G," and "B" define a colorspace such as RGB (e.g., a first colorspace based on a tristimulus system), and in various embodiments custom color-channels can be created using a (second) tristimulus system associated with and defining an XYZ (second, e.g. converted-to, colorspace).

In various embodiments, a single color-channel may contain more than one bit of data, e.g. at least two distinct bits of data representing at least two colors associated with a color-channel from; for example, if a conversion between a first colorspace containing one or more colors, e.g. red and blue, into a second colorspace takes, then the second colorspace may contain a single color-channel, e.g. purple, that contains data from both color-channels of the first color-channel, e.g. "red" and "blue." Accordingly, in various embodiments, a single color-channel can contain a superposition of information, with values of the color-channel representing more than one bit of data, as the converted-to or second colorspace and associated color-channel(s) may be a combination of colors from the first colorspace each containing or associated with a bit of data. In various embodiments, the superposition of colors into a single color-channel may result in multiple bits along a larger set of values of that color-channel, e.g. a color-channel such as purple may be between 0 and 510, where multiple bits may be represented between the values, e.g. if two colors are represented by purple associated with a converted-to XYZ space (or other suitable colorspace) (from a converted-from colorspace), two bits of data may be represented by the purple channel with four ranges along the range capable of determining a "0" or "1" value for the two bits. In various embodiments, in instances where multiple bits are represented by a color-channel, a cipher and/or key may provide the ordering of the bits, e.g. the order that information is to be sequenced from the ranges of the color-channels (the cipher may provide additional information, e.g. the definition of the colorspace conversion and the ordering or sequencing associated with multiple color-channels).

Accordingly, in various embodiments, the colorspace and encoding mechanism 180 may perform a colorspace conversion from one colorspace, e.g. a first colorspace, such as RGB, representing data sets as a plurality of light signals, into at least one other different colorspace representing an encoded version of the datasets as another plurality of light signals, e.g. lights signals according to a second (or more) colorspace, e.g. XYZ or LAB, such that at least one color-channel of the second colorspace represents at least two colors and/or color-channels associated with the first colorspace. In various embodiments, the conversion or conversions may result in superior compression and encoding for the conversion from datasets 172 into encoded datasets 182 as the encoded data sets 182 are transmitted along the line at least because a single color-channel of the converted-to colorspace or colorspace may represent multiple colors or color-channels from the converted-from colorspace.

In various embodiments, the colorspace and encoding mechanism 180 may be based on multiple colorspace conversions, where a second (or additional) conversion(s) may be done to enhance compression and facilitate superior encoding of the encoded data 182 representing datasets 172 and transmitted along a transmission medium, such as a fiberoptic cable. In various embodiments, the color-channels of any of the colorspaces may be greater than three, e.g. colors that are imperceptible to the human eye can be used provided the fiberoptic transmitter or receiver receiving the transmission is suitable for generating the appropriate light signals and/or is equipped with a receiver for receiving (and decoding the same). In various embodiments, one or more fiber optic transmitters or receivers can implement one or more colorspaces with at least one-thousand or more distinct color-channels and greater or equal to sixty-four bits of data per colorspace, with each color-channel containing encoded information and at least one color-channel containing color-channels from a converted-from colorspace, e.g. information associated with encoded datasets 182.

In various embodiments, as described herein, depending on the hardware and/or software components selected with respect to nodes on the transmission mode, e.g. fiberoptic transmitters or receivers, one colorspace model (e.g. XYZ) may correspond to a higher likelihood of success in terms of being generated, encoded and transmitted by a transmitter and/or detected and decoded than another colorspace. Accordingly, in various embodiments, the colorspace and associated colors selected for the encoding scheme of the datasets 172 can be selected with optimization of encoding, transmitting, scanning, and decoding in mind.

In various embodiments, the logic 160 is further operative to cause the processing circuit 140 to apply an additional encoding mechanism 170 to datasets 172 unrelated to colorspace transformations, prior to or after performing the colorspace conversion and encoding associated with the colorspace transform and encoding mechanism 180. For example, the encoding mechanism 170 may perform PGP encryption on datasets 172 before any component converts them to a light signal and/or before performing any colorspace conversion in association therewith. The additional layer of encryption may further enhance compression and provide additional security for the encoded data 182 as it is transmitted across as transmission medium.

In various embodiments, the logic 160 is further operative to cause the processing circuit 140 to apply a detection and decoding mechanism 190 at any suitable node or point along a transmission medium carrying the encoded data, including at a receiver along a fiberoptic line. The detection and decoding mechanism 190 may cause a receiving device to apply various sensors each associated with the detection of one or multiple color-channels to detect the signal or signals carrying the encode data, where the multiple color-channels are part of the one or more signals carrying the encoded data 182. In various embodiments, not all of the color-channels associated with the light signals carrying encoded data 182 contain the encoded data 182, which may increase the security of the transmission techniques.

In various embodiments, the detection and decoding mechanism 190 may utilize a cipher 188 to decode or decrypt the encoded data 182, e.g. the detection and decoding mechanism 190 may instruct suitable hardware or software components associated with a fiberoptic node, such as a fiberoptic receiver, to decode the encoded data 182.

In various embodiments, the cipher 188 may provide the fiberoptic receiver with (and/or configure the receiver to perform a decoding operation with i) the key defining the one or more colorspace conversions, e.g. mathematical definition of at least one of the colorspaces that are converted to, including a final colorspace of one or more colorspace conversions, and by extension the color-channels that contain or are associated with encoded data 182, including superimposed colors or color-channels associated with a converted-from colorspace, ii) the order or sequencing of information, e.g. color values or range values, of data associated with the color-channels containing the encoded data 182, e.g. the bit order or sequencing of the color values of a particular color-channel iii) the order or sequencing of the color-channels containing the encoded data with respect to one another, e.g. the bit sequence that bits are to be ordered between and amongst color-channels, iv) the timing at which a sensing or detection should occur, e.g. the logic 160 may instruct processor to cause a transmitter to transmit signals with no data for defined or random intervals (or intervals based on a processing threshold at one or more nodes) throughout the transmission line, and as such, the cipher 188 may provide the timing to scan data containing signals actually carrying the encoded data 182, and/or v) any decryption technique that may be applied to a non-colorspace encryption technique applied to datasets 172, such as PGP encryption.

In various embodiments, as stated above, the colorspace conversion from one colorspace to another colorspace forms part of the basis for encrypting, e.g. by the colorspace transform and encoding mechanism 180, the datasets 172 into encrypted or encoded datasets 182, and by extension the decoding or decryption of the encrypted or encoded datasets 182. Accordingly, the encryption or encoding and decryption or decoding, may be based in part on the key or mathematical relationship defining the relevant colors and color-channels of the colorspace and associated with one or more colorspace conversions. For example, if the colorspace scheme associated with the image is an XYZ colorspace, then one or more color-channels of the XYZ colorspace are defined by a tristimulus scheme as defined and described with respect to FIG. 1A. In the context of system 100B, this means that one or more color-channels are defined by the above equation and can be used to create one or more color-channels in the XYZ colorspace, including colors and color-channels imperceptible to the human eye, and the above equation may also provide, in part, the basis for cipher 188 to allow a component to decode or decrypt the encrypted data 182.

In various embodiments, the encoding may be such that x, y, and z may have certain values that define the particular color-channels associated with the space, and pre-defined color range values within the channel may determine whether the channel represents a "1" or a "0" bit value (or bit values in the instance where a color-channel represents multiple bit values by superimposition). Without knowing the initial x, y, and z values of the various color-channels, decoding the encrypted data 182 may not be possible, and this feature can be amplified, in various embodiments, by having a fiberoptic transmitter transmit light signals that do not contain or are not associated with any data (encoded or otherwise). Accordingly, the equations governing the particular colorspace, of which the above is one example and for one colorspace conversion or conversions, provide the basis for encoding the datasets 172 into encoded data 182 suitable for transmission along a transmission medium, such as fiberoptic cable, and also the basis for decoding encoded data 182 at a suitable point along the transmission medium, such as a fiberoptic receiver.

Accordingly, one node of a transmission medium associated with input 110, e.g. a fiberoptic transmitter, may be configured by apparatus 120 to encode one or more datasets 172 using the mathematical relationship governing a colorspace, e.g. Equation 1, which in turn determines, in part or in whole, a cipher 188 that can decode or decrypt the encoded data 182 at an output 130, e.g. a fiberoptic receiver, which can decode or decrypt the encoded data based on the mathematical relationship or key, e.g. Equation 1, defining the colorspace conversion.

In various embodiments, cipher 188 is an alternating cipher 188 that may be dynamically updated by the colorspace transform and encoding mechanism 180 during each transmission of data or during a predefined interval. The update may include any modification that changes the relevant information necessary for decryption or decoding (e.g. changing the nature of encoding or encryption) including i) changing which color-channels of the converted-to colorspace contain the encoded data 182, ii) changing the nature, if any, of any superimposition of a converted-from color-channel or color as represented in the color-channels of the converted-to color-channels, iii) changing the order or sequencing of information, e.g. color values or range values, of data associated with the color-channels containing the encoded data 182, e.g. the bit order or sequencing of the color values of a particular color-channel, iv) any encryption applies to the encoded data 182 based on a non-colorspace encryption technique applied to datasets 172, such as PGP encryption, including changing or eliminate the non-color based encryption, v) changing the timing at which a sensing or detection should occur (based on a timing or processing threshold at a node, vi) changing the range values of one or more color-channels contained or associated with encoded data 182 by performing a mathematical operation on value ranges of the one or more color-channels, such as an addition, multiplication, division or other suitable operation that would affect the range values defining bit values in that color-channel or color-channels, vii) using a completely different colorspace conversion to represent a first transmitted portion of encoded datasets 182, e.g., a portion of datasets 172 are associated and transmitted with a colorspace conversion that culminates in the XYZ space and a subsequent transmission is governed by a different culmination (and by extension a different mathematical equation or key defining the conversion and converted-to colorspace) of a colorspace conversion, e.g. LAB, with respect to another portion of datasets 172 as represented by another portion of encoded datasets 182. For example, a portion of datasets 172 may be encoded and form a portion of encoded dataset 182 and transmitted based on a first set of one or more colorspace conversions and transmitted along the transmission medium, such as a fiberoptic cable, and another portion of datasets 172 may be encoded pursuant to a different one or colorspace conversions performed by the colorspace transform and encoding mechanism 180.

In various embodiments, the detection and decoding mechanism 190 may update the cipher 188 when the encoding mechanism and 180 changes the encryption technique with the relevant key, e.g. mathematical relationship defining the converted-to colorspace, thus permitting proper decoding and decryption at output 130, e.g. fiberoptic receiver, of the transmission medium, e.g. fiberoptic line or cable.

In various embodiments, and as discussed in more detail with respect to one or more embodiments provided below, if the initial or subsequent (in instances where multiple colorspaces and conversions thereto or therefrom are used) colorspace has a luminance factor, such as an XYZ colorspace, the luminance factor may be temporarily filtered out when determining the various chromacity values desired for use with encoded datasets 182.

In various embodiments, the luminance factor, e.g. "y" of Equation 1, may be reintroduced (or used from the outset if it was never filtered out), to define tangential information related to the encoded data 182, such as an error correcting code, e.g. Hamming code. Accordingly, in various embodiments, logic 160 may be further operative to cause the processing circuit 140 to configure the colorspace conversion and encoding mechanism 180 to encode tangential data based on a brightness value of transmitted light signals e.g. a range of brightness values correspond to a "1" bit value (brightness higher than or equal to a certain value) and a range of values correspond to a "0" bit value (brightness less than a certain value). In various embodiments, logic 160 may be further operative to cause the processing circuit 140 to configure the detection and decoding mechanism 190 to cause a suitable node along a transmission line, such as a fiberoptic receiver, to associate particular data distinct from the datasets 172 (and by extension encoded datasets 182) in relation to the luminance value (brightness or light strength of a transmitted signal carrying one or more color-channels with encoded datasets 182).

In various embodiments, when transmitting an encoded data set with an ECC, such as a Hamming Code, one or more light signals associated with one or more color-channels, one or more ultraviolet layers, one or more infrared layers can be encoded with data (e.g. multimedia data, informational data, etc.) and/or with a portion of the ECC. In various embodiments, at least one bit of data and/or ECC portions are represented by any one of the one or more color-channels, one or more ultraviolet layers, one or more infrared layers, and/or one or more luminance channel. In various embodiments, and as alluded to above and below, a defined set of light signals will represent one or more bits of data (e.g. the datasets 172 and by extension the encoded datasets 182), e.g. if a color associated with a color-channel exceeds a certain value in relation to the range of values of a color-channel, it then can be a "1" and if it is below a certain threshold value in relation to the range of values of that color-channel then the value can be a "0," where the threshold scheme can be used for the data portion and ECC portion of a combined information set, message, or data entity as encoded on through the transmission medium. In various embodiments, the presence or absence of ultraviolet layer constitutes a bit of data, e.g. a value of "1" if ultraviolet light is carried as part of the light signals representing the data and a value of "0" if it is not carried as part of the light signals constituting the data with respect to either one of the data portion or ECC portion of the message, and similarly the presence or absence of an infrared layers constitutes a bit of data, e.g. a value of "1" if infrared light is carried by the light signals representing the data and a value of "0" if it is not carried with respect to either one of the data portion or ECC portion of the message as transmitted across the transmission medium. In various embodiments, an intensity level of either or both of the ultraviolet or infrared layers may be used to obtain a value of "1" and/or "0," or a threshold with respect to the ultraviolet or infrared spectrums can be used. In various embodiments, the presence or absence of a luminance layer as carried by the light signals constitutes a bit of data, e.g. a value of "1" if a certain threshold of luminance intensity is exceeded and a "0" if it is below that value.

In various embodiments, the logic 160 is operative to cause the processing circuit 140 to create a first data set as part of the data 172 and by extension as part of the encoded data set 182. The first data set can include any suitable data, e.g. informational, multimedia, etc. and it can be encoded pursuant to a color-channel scheme with at least four-color-channels, where the four-color-channels may or may not be optimized for detection as discussed herein. In various embodiments, the logic 160 is operative to cause the processing circuit 140 to create a second data set as part of the dataset 172 and by extension the encoded dataset 182, where the second dataset is representative of an ECC with a bit of ECC data distributed to each one of an ultraviolet channel, an infrared channel and a luminance channel. Accordingly, in various embodiments, a first data set includes four bits of data, with each bit being distributed or represented by a distinct one of the four color-channels, and three bits being represented distinctly by each one of the ultraviolet channel, the ultraviolet channel, and the luminance channel. In various embodiments, variations of the distribution of the first data set and the second data set are represented by any combination of color-channels and luminance, ultraviolet and infrared channels. In various embodiments, the logic 160 is operative to cause the processing circuit 140 to configure and apply the colorspace transform and encoding mechanism 180 in order to combine the first data set and the second data set for transmission along a transmission medium, e.g. fiber-optic cable 195, pursuant to the data combination and as light signals across the medium. In various embodiments, in order to preserve data detection, the first data set is encoded along any combination of the four color-channels, the ultraviolet layer, and the infrared layer, with four bits being distributed along those channels and with each channel representing a bit of data. In various embodiments, since the luminance channel is more prone to detectability issues across the transmission medium, to preserve the detectability of the first data, at least one bit of the ECC is carried along the luminance channel and two bits are carried along the remainder of the four color-channels, the ultraviolet layer and the infrared layer that does not carry the first data set. In various embodiments the ECC is encoded along the luminance channel, the ultraviolet channel, and the first data set along the four color-channels. Accordingly, in various embodiments, four bits of data and three bits of ECC are encoded on a combination of at least four color-channels, an infrared channel, an ultraviolet channel, and a luminance channel and for transmission along a transmission medium.

In various embodiments, the logic 160 is further operative to cause the processing circuit 140 to identify which colorspace model to use in encoding and transmitting a given image prior to the colorspace transformation and encoding mechanism 180 performs the encodings, e.g. optimizing which colorspace conversion to perform based on the capabilities of the hardware, e.g. transmitting and sensing devices of the nodes along the transmission medium. For example, the logic 160 is further configured to cause the processing circuit 140 to apply the colorspace transformation and encoding mechanism 180 to transform datasets 172 into encoded datasets 182 by converting from one colorspace representing datasets 172, e.g. RGB, into another colorspace model (e.g. XYZ), where the other or second colorspace model has a higher likelihood than the first colorspace model at detection at an output node, e.g. output 130 as a fiberoptic receiver. It is appreciated that the other colorspace model may be any colorspace model including those with a different number of channels than the first colorspace model.

The one or more colorspace models as described herein, as stated and implied elsewhere herein, refers to any suitable colorspace model, such as colorspace employing a tristimulus system or scheme, the Red-Green-Blue (RGB), the Luminance-Alpha-Beta (LAB), an XYZ colorspace, and/or the like and/or variations of the same. Similarly, although various embodiments may refer to a particular conversion from one specific colorspace to another specific colorspace, conversions between other colorspaces are contemplated and consistent with the teachings of the present disclosure.

Figure 2A:
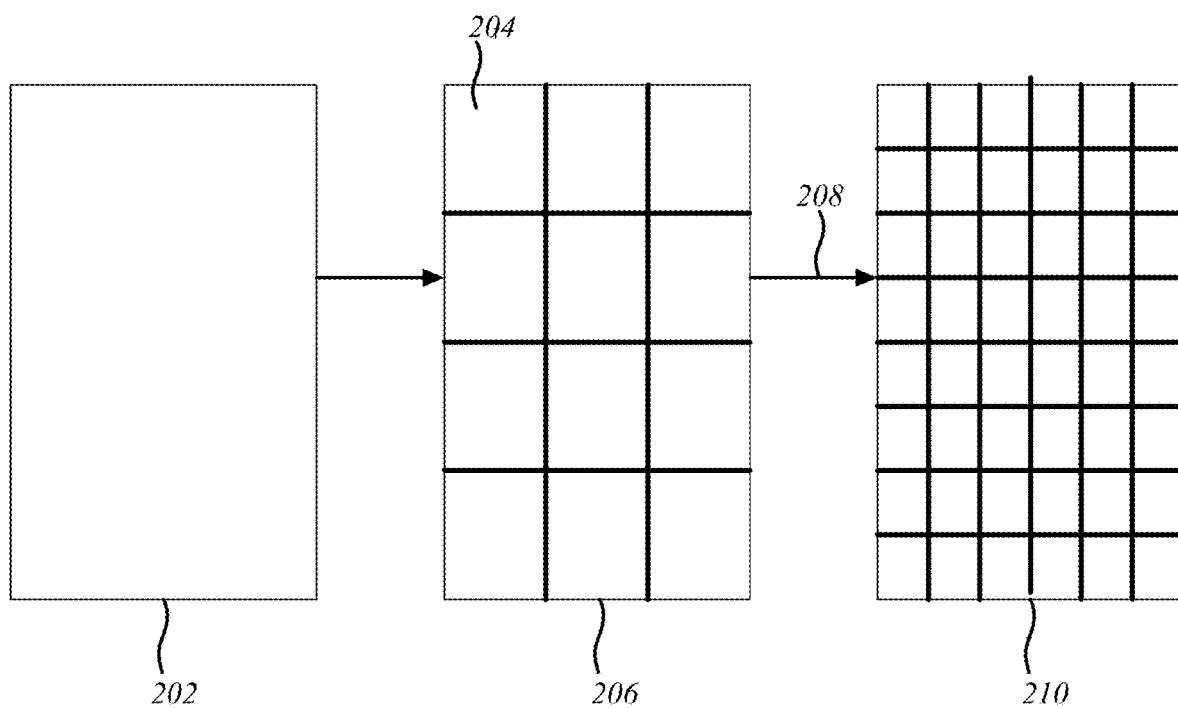
FIG. 2A illustrates an embodiment of a clustering process for the system of FIG. 1A or FIGS. 1B and 1n accordance with at least one embodiment of the present disclosure.

FIG. 2A illustrates an embodiment of a clustering process 200A for the system 100. The clustering process 200 operates on image datasets (e.g., the data sets 170 and/or image datasets 172 of FIG. 1A and/or FIG. 1B) storing color data for images.

In some embodiments of the clustering process 200, color data 202 of an image undergoes a patching operation where the image is processed into a plurality of patches 204 of patched image data 206. Each patch 204 of the patched image data 206 includes color data in accordance with a colorspace model, such as pixel data having RGB tuples, where the pixel may represent an encoded representation of data. The clustering process 200 further processes the patched image data 206, via a transformation operation 208, by applying a colorspace transform mechanism on the color data of the patched image 206 to transform patched image data into transformed image data of a transformed image 210, where the transformed image may also represent an encoded representation of data. The color data of the patched image 206 is configured in accordance with the colorspace model and new color data for the transformed image 210 is generated according to another colorspace model.

In some embodiments, the clustering process 200 performs a mini-colorspace transform for at least one patch of the patched image 206, possibly leaving one or more patches without a transformation. Via the transformation operation 208, the mini-colorspace transform modifies the color data in the at least one patch to transform patched image data into transformed image data of a transformed image 210. The clustering process 200 may perform stitching between patches to make the patched image 206 uniform as opposed to creating artificial edges.

Figure 2B:
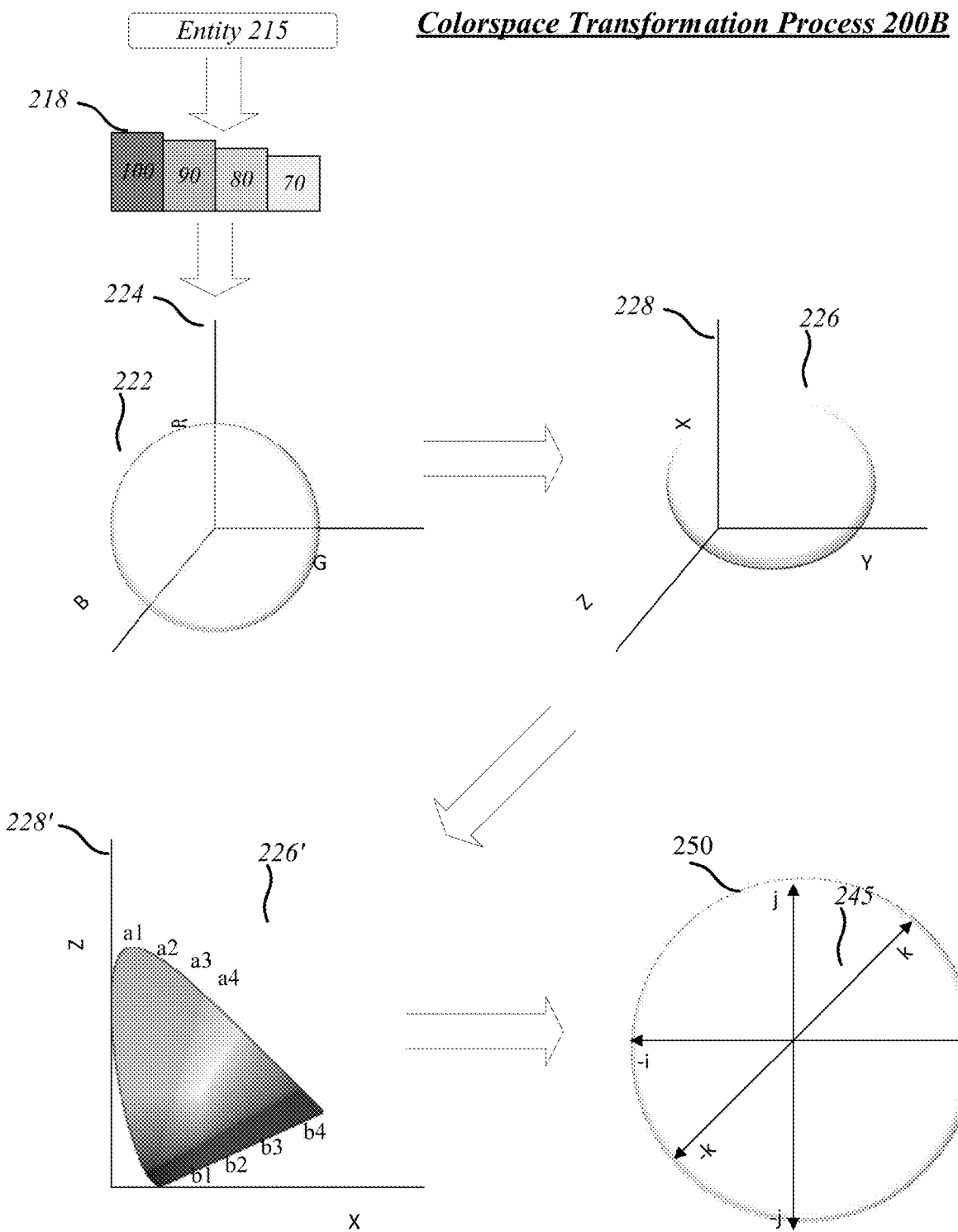
FIG. 2B illustrates an embodiment of a colorspace conversion technique useful for encoding and/or decoding data, including by the system of FIG. 1A or FIG. 1B, and in accordance with at least one embodiment of the present disclosure.

FIG. 2B illustrates an example of a colorspace conversion scheme 200B in accordance with various embodiments of the present disclosure. A histogram 218 representation of a particular environment 215 is provided (where the numbers 100, 90, 80, and 70 are intended to represent a simplified version of colors distribution values of one or more colors representing the particular object, entity, or environment 215), where the environment 215 may be associated with a scan of printable material representing encoded data of any kind and/or data encoded for transmission along a transmission medium, where in various embodiments the data is data (e.g. multimedia data, such as video data, audio data, image data, spatial data (which can create three-dimensional renderings), etc.). The histogram 218 can be generated by having one or more components of system 100 performing a scan of the environment 215 and generating a histogram 218 of the most prevalent colors, least prevalent colors, or absent colors of the environment 215. In one or more embodiments, the histogram 218 can be of four, six, eight or more colors of the most prevalent colors of the object, entity, or environment. Since various embodiments of the present disclosure expressly contemplate using colors imperceptible to the human eye, there is no limitation on the number of colors that can be used with respect to the histogram 218, the colorspace conversions discussed herein, or any images generated from the colorspace conversions, including but not limited to image data providing an encoded representation of multimedia data (e.g. video data, audio data, image data, spatial data (which can create three-dimensional renderings), etc.), and can have in excess of four colors, six color, or eight colors, and four color-channels, six color-channels, or eight color-channels, where the colors and/or color-channels are distinct and different with respect to one another. The graphical representation 218 can be generated by having one or more components of system 100A facilitate detection of the light signals 215 along a transmission medium and generating the graphical representation 218 and/or utilize system 100B for printing or scanning of the most prevalent colors, least prevalent colors, or absent colors associated with the light signals 215. In one or more embodiments, the graphical representation 218 can be of four, six, eight or more colors of the most prevalent colors of light signals 215. Since various embodiments of the present disclosure expressly contemplate using colors imperceptible to the human eye, there is no limitation on the number of colors that can be used with respect to the graphical representation 218, the colorspace conversions discussed herein, or any light signals generated or detected based on the colorspace conversions (thousands of color-channels are contemplated with respect to any of the colorspace models and colorspace conversions according to various embodiments of the present disclosure, provided suitable transmitters and receivers are utilized in accordance with one or more embodiments of the present disclosure).

In various embodiments, one or more components of system 100 can determine the most prevalent colors associated with environment 215, and the resulting histogram 218 may be based on that determination. The histogram 218 can be used to map the most prevalent colors to a distribution 222 associated with a suitable colorspace 224, including but not limited to an RGB colorspace 224. In various embodiments, the colors of histogram 218 are mapped pursuant to the tristimulus values of the RGB colorspace, e.g., "R," "G," and "B." Any suitable mathematical conversion, e.g., linear-algebraic, etc. can be used to map the conversion to the RGB colorspace, e.g., convert the mapped RGB colorspace to another colorspace.

In various embodiments, the color-channels of distribution 222 may represent one or more bits of data for an encoded representation of data, e.g. multimedia data, where the data may be compressed or un-compressed.

In various embodiments, once the distribution 222 is mapped according to the RGB colorspace 224, one or more components of system 100 can convert the RGB distribution 222 to a new colorspace 226 with a distribution 228 pursuant to the new colorspace 226. Any suitable colorspace conversion can be used, including converting to an XYZ colorspace, where the conversion can be pursuant to any suitable mathematical conversions and equations that govern the XYZ colorspace, including suitable tristimulus conversions between RGB and XYZ. In various embodiments, "Y" represents a luminance value of the XYZ space and at least one of "X" and "Z" (or both) represent a chrominance value of the colorspace and an associated distribution, e.g. 226 plotted pursuant to the XYZ colorspace.

In various embodiments, the color-channels of new colorspace 226 may represent one or more bits of data for an encoded representation of data, e.g. multimedia data, where the data may be compressed or uncompressed. In various embodiments, the encoding is limited to the second conversion, e.g. only the color-channels of new colorspace 226 provide for an encoded representation of data. In various embodiments, both the color-channels of colorspace 224 and colorspace 226 provide for an encoded representation of data, whether compressed or uncompressed, thus providing for multi-level encryption.

In various embodiments, the luminance channel "Y" is filtered out resulting in colorspace 228' and distribution 226', which can assist in making determinations solely on actual chromatic values associated with the entity, object, or environment 215, without considering luminance (this is helpful at least because colors can be used that are imperceptible to the human eye). In various embodiments, four (or more) lines can be defined by points (a1, b1), (a2, b2), (a3, b3), and (a4, b4), and are selected to have a maximum distance apart with respect to distribution 226'. In various embodiments, the points a1, a2, a3, and a4 are selected to correspond to the most prevalent colors associated with entity, object, or environment 215 and b1, b2, b3, and b4 by extension, being opposite to those colors, may represent the least prevalent or absent colors in association with entity, object, or environment b1, b2, b3, b4. These lines may define vectors for a new colorspace conversion in an XYZ or other suitable colorspace 245 and may form the basis for new XYZ tristimulus values.

An image or image set, such as the patched image data 172 representing encoded data, e.g. multimedia data (e.g. video data, audio data, image data, spatial data (which can create three-dimensional renderings), etc.), as discussed above, can be made using colors associated with the new colorspace 250 and a distribution 245 of colors defined by color-channel vectors (i, −i), (j, −j), (k, −k), an additional color-channel and all other color-channels (omitted from display due to the limitations of three-dimensional space) associated therewith. In various embodiments, since the colors may correspond to less prevalent or absent colors in relation to where a potential scan may occur (or what is being scanned), e.g., printed material corresponding to encoded data in an environment with colors that have a maximum difference in relation thereto, edge detection is enhanced and/transmitted light signals along a transmission line.

Alternatively, although not expressly shown, the maximum distance from the most prevalent colors to least prevalent colors can be determined, e.g., a1 to b1, a2 to b2, etc., and then lines can be drawn from b1, b2, b3, and b4 in a direction tangential, parallel or opposite a vector or direction associated with a1, a2, a3, and a4. The color-channel vectors (i, −i), (j, −j), (k, −k), an additional color-channel and all other color-channels (omitted from display due to the limitations of three-dimensional space) associated with colorspace 250 may be entirely colors absent and/or mildly prevalent in relation to entity, object, or environment 215, which can further enhance edge detection.

In various embodiments, the color-channels of new colorspace 250 may represent one or more bits of data for an encoded representation of data, such as multimedia data (e.g. video data, audio data, image data, spatial data (which can create three-dimensional renderings), etc.), where the data may be compressed or uncompressed. In various embodiments, the encoding is limited to the conversion associated with new colorspace 250, e.g. only the color-channels of new colorspace 226 provide for an encoded representation of data. In various embodiments, more than one of the color-channels of colorspace 224, colorspace 226, colorspace 228', and/or colorspace provide for an encoded representation of data, whether compressed or uncompressed, thus providing for multi-level encryption.

In various embodiments, whether luminance channel "Y" is filtered out or whether it remains unfiltered throughout one or more colorspace conversions, it may be used to provide an encoded representation of tangential information in relation to the encoded data, such as page orientation information, metadata, page numbers, and/or party bits (Hamming code). In various embodiments, where the luminance channel "Y" is filtered out in relation to colorspace 228', it can be reintroduced at any subsequent conversion when chromacity values have been determined, such as with respect to new colorspace 250, in order to provide for the luminance encoding feature in association with tangential information.

In various embodiments, when performing the colorspace conversion between 228' and 250, in addition to carrying out the algebraic or other suitable conversions associated with the XYZ colorspace, the color-channel vectors, e.g. (i, −i), (j, −j), (k, −k), may be orthogonal to one another by performing any suitable mathematical and/or orientation operation on the vectors and/or by selecting suitable points on colorspace 226' and distribution 228' when making the conversion. In various embodiments, a second maximum difference between one or more points can be taken in space 250, in addition to an orientation operation to center the distribution 245 along the axis of the newly defined color-channel vectors, e.g. (i, −i), (j, −j), (k, −k), such that the color-channel vectors are orthogonal and have a maximum distance in relation to one another. In various embodiments, performing at least one of the orthogonality operation, maximum determination, and/or orienting operation can further enhance edge detection of an image generated for scanning, such as an encoded scheme printed on a physical medium, in relation to an entity, object, or environment 215 to be scanned and/or light signals transmitted via a transmission medium and in accordance with the scheme.

In various embodiments, the various color-channels described above, including each vector, e.g. (−i, i), defines a first color that is a minimum in the color-channel and the second color becomes the maximum, such that the boundary may be a transition between these colors. This boundary may be at least one pixel where the color changed from the first to the second color or vice versa. If the first color is set to zero (0) and the second color is set to two hundred and fifty-five (255), then, mathematically, this boundary may be located at pixel(s) that jumped between the minimum and maximum value; for example, there may be sharp division (i.e., thin boundary) in which at least two neighboring pixels transition immediately between 0 and 255. In various embodiments, the boundary is such it may be a transition between these colors where, as discussed above, one or more color-channel ranges are selected such that a maximum color value of one or more color-channel corresponds to a unique color value, most prevalent color value, and/or highest color value of a target object, entity, and/or environment associated with a scan and the minimum color value of the color-channel corresponds to a most unique color, most prevalent color value and/or highest color value of the printed scheme corresponding to printed encoded data and/or data transmitted and encoded via a transmission medium, e.g. multimedia data (e.g. video data, audio data, image data, spatial data (which can create three-dimensional renderings), etc.), where additionally, the most prevalent value and/or highest color value of the printed encoded data and/or transmitted encoded data is also a least prevalent (lowest color value) and/or absent from the target object, entity, and/or environment associated with a scan or printing of the printed material and/or transmission or detection of transmitted lights signals, or visa-versa (e.g. with respect to the maximum or minimum values).

The length of the color-channel can be adjusted accordingly based on the capabilities of the scanning and image-acquiring abilities of the various components, e.g. camera or video device 195, scanning device 197, and/or recognition component 422-4 (discussed below with respect to FIG. 4), where the length increases the number of different colors between the minimum and maximum point of the color-channel.

In various embodiments, the conversions between the RGB colorspace to the XYZ colorspace and/or a first converted-to (derivative) XYZ space to another XYZ colorspace can be governed by the tristimulus equations (Equation 1) that define the converted colorspace and a distribution of colorspace, where the value of x+y=z can be normalized to 1.

In various embodiments, the value of "X," "Y," and "Z," is dependent on the input colors from the RGB colorspace (or in the case of a second conversion, from the converting colorspace). Although the tristimulus values are three be definition, as noted above, the conversion can involve more than three color-channels, including color-channels that define colors imperceptible to the human eye. In various embodiments, the conversion governed by Equation. 1 can form a key for a scanning device to scan or print an image defined by the conversion, such as an encoded data, e.g. data scheme (e.g. video data, audio data, image data, spatial data (which can create three-dimensional renderings), etc.) printed on a physical medium, and/or the key for transmitting data along a transmission medium pursuant to the conversion. In various embodiments, this means that in addition to providing a vehicle for increasing the numbers of color-channels and colors for an image to be scanned, printed or transmitted, which means increasing bits of information that can be encoded therein, another benefit of various embodiments is offering a manner to securely encode information, e.g. without knowing the equation or equations of what colorspace govern and without knowing the input values (which are based on the first colorspace associated with the entity, object, or environment 215), a successful scan cannot occur. Accordingly, in various embodiments, the logic 160 of system 100A and/or 100B can cause a processor 140 (or an application programmed to carried out the operations of 100A and/or 100B) to provide a suitable component with, e.g. component 190 of system 100A and/or system 100B, a key governed by Equation 1 in order to scan and decode an image, e.g. printed or scanned material and/or transmitted data along a transmission medium corresponding to encoded data (e.g. video data, audio data, image data, spatial data (which can create three-dimensional renderings), etc.) that is encoded pursuant to one or more colorspace conversions associated with Equation 1.

In various embodiments, the logic 160 of system 100A can cause a processor 140 to provide a scheme for adding either one or both of an ultraviolet layer and/or an infrared layer to a scheme defining encoded data, e.g. multimedia data (e.g. video data, audio data, image data, spatial data (which can create three-dimensional renderings), etc.), and instruct a printing device 199 to print the same, where the printed encoded data contains more than one non-black or non-white colors governed by any suitable colorspace, and can be scanned and decoded by a suitable scanning device, e.g. scanning device 197. In various embodiments, the logic 160 of system 100B can cause a processor 140 to provide a scheme for adding either one or both of an ultraviolet layer and/or an infrared layer to a scheme defining encoded data to be transmitted over a transmission medium 198, e.g. multimedia data (e.g. video data, audio data, image data, spatial data (which can create three-dimensional renderings), etc.), encoded data contains more than one non-black or non-white colors governed by any suitable colorspace, and can be suitably decoded by a suitable decoding technique 190. In various embodiments, the scheme may include both an ultraviolet layer and an infrared layer, where the ultraviolet layer may form the first layer of an image in order to take advantage of its properties. In various embodiments, the non-black and non-white colors of the printed and/or transmission scheme can correspond to encoded data of any kind and may be determined by one or more colorspace conversion techniques as outlined herein. In various embodiments, non-black and non-white colors means colors that are not black or white. In various embodiments, non-black and non-white colors means colors that are not black, white or based on a greyscale distribution.

Figure 3:
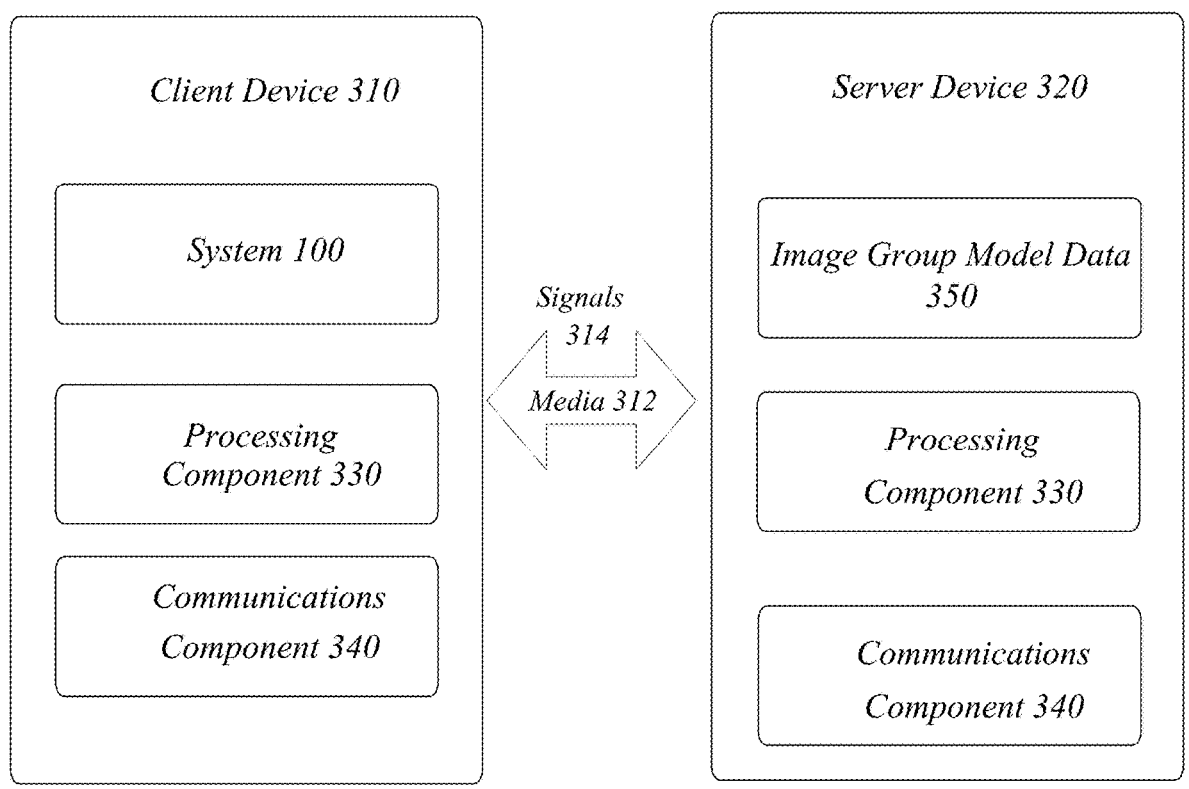
FIG. 3 illustrates an embodiment of a centralized system for the system of FIG. 1A or FIG. 1B in accordance with at least one embodiment of the present disclosure.

FIG. 3 illustrates a block diagram of a distributed system 300. The distributed system 300 may distribute portions of the structure and/or operations for the system 100 across multiple computing entities. Examples of distributed system 300 may include without limitation a client-server architecture, a 3-tier architecture, an N-tier architecture, a tightly-coupled or clustered architecture, a peer-to-peer architecture, a master-slave architecture, a shared database architecture, and other types of distributed systems. The embodiments are not limited in this context.

The distributed system 300 may comprise a client device 310 and a server device 320. In general, the client device 310 and/or the server device 320 may be the same or similar to the apparatus 120 as described with reference to FIG. 1A and/or FIG. 1B. For instance, the client device 310 and the server device 320 may each comprise a processing component 330 which is the same or similar to the processing circuit 140 as described with reference to FIG. 1A and/or FIG. 1B. In another example, the devices 310, 320 may communicate over a communications media 312 using communications signals 314 via a communications component 340.

The server device 320 may communicate with other devices over the communications media 312, using communications signals 314, via the communications component 340. The other devices may be internal or external to the device 320 as desired for a given implementation.

The client device 310 may comprise or employ one or more client programs that operate to perform various methodologies in accordance with the described embodiments. In one embodiment, for example, the client device 310 may implement the system 100 including the logic 160 of FIG. 1A and/or FIG. 1B, where in various embodiments, the client device 310 can implement one or more operations to form an image based on one or more colorspace conversions as outlined above and herein.

The server device 320 may comprise or employ one or more server programs that operate to perform various methodologies in accordance with the described embodiments. In one embodiment, for example, the server device 320 may implement the clustering process 200A of FIG. 2A and generate image group model data 350 and/or generate image group model data 350 by performing one or more of the encoding and colorspace conversion operations of scheme 200B. The image group model data 350 can include a printing scheme or color distribution for an image corresponding to encoded data, e.g. multimedia data (e.g. video data, audio data, image data, spatial data (which can create three-dimensional renderings), etc.), e.g. patched image data 172, to be printed, scanned, and/or transmitted in association with an environment 215.

The devices 310, 320 may comprise any electronic device capable of receiving, processing, and sending information for the system 100. Examples of an electronic device may include without limitation an ultra-mobile device, a mobile device, a personal digital assistant (PDA), a mobile computing device, a smart phone, a telephone, a digital telephone, a cellular telephone, ebook readers, a handset, a one-way pager, a two-way pager, a messaging device, a computer, a personal computer (PC), a desktop computer, a laptop computer, a notebook computer, a netbook computer, a handheld computer, a tablet computer, a server, a server array or server farm, a web server, a network server, an Internet server, a work station, a mini-computer, a main frame computer, a supercomputer, a network appliance, a web appliance, a distributed computing system, multiprocessor systems, processor-based systems, consumer electronics, programmable consumer electronics, game devices, television, digital television, set top box, wireless access point, base station, subscriber station, mobile subscriber center, radio network controller, router, hub, gateway, bridge, switch, machine, or combination thereof. The embodiments are not limited in this context.

The devices 310, 320 may execute instructions, processing operations, or logic for the system 100 using the processing component 330. The processing component 330 may comprise various hardware elements, software elements, or a combination of both. Examples of hardware elements may include devices, logic devices, components, processors, microprocessors, circuits, processing circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), Application-specific Standard Products (ASSPs), System-on-a-chip systems (SOCs), Complex Programmable Logic Devices (CPLDs), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

The devices 310, 320 may execute communications operations or logic for the system 100 using communications component 340. The communications component 340 may implement any well-known communications techniques and protocols, such as techniques suitable for use with packet-switched networks (e.g., public networks such as the Internet, private networks such as an enterprise intranet, and so forth), circuit-switched networks (e.g., the public switched telephone network), or a combination of packet-switched networks and circuit-switched networks (with suitable gateways and translators). The communications component 340 may include various types of standard communication elements, such as one or more communications interfaces, network interfaces, network interface cards (NIC), radios, wireless transmitters/receivers (transceivers), wired and/or wireless communication media, physical connectors, and so forth. By way of example, and not limitation, communication media 312 include wired communications media and wireless communications media. Examples of wired communications media may include a wire, cable, metal leads, printed circuit boards (PCB), backplanes, switch fabrics, semiconductor material, twisted-pair wire, co-axial cable, fiber optics, a propagated signal, and so forth. Examples of wireless communications media may include acoustic, radio-frequency (RF) spectrum, infrared and other wireless media.

Figure 4:
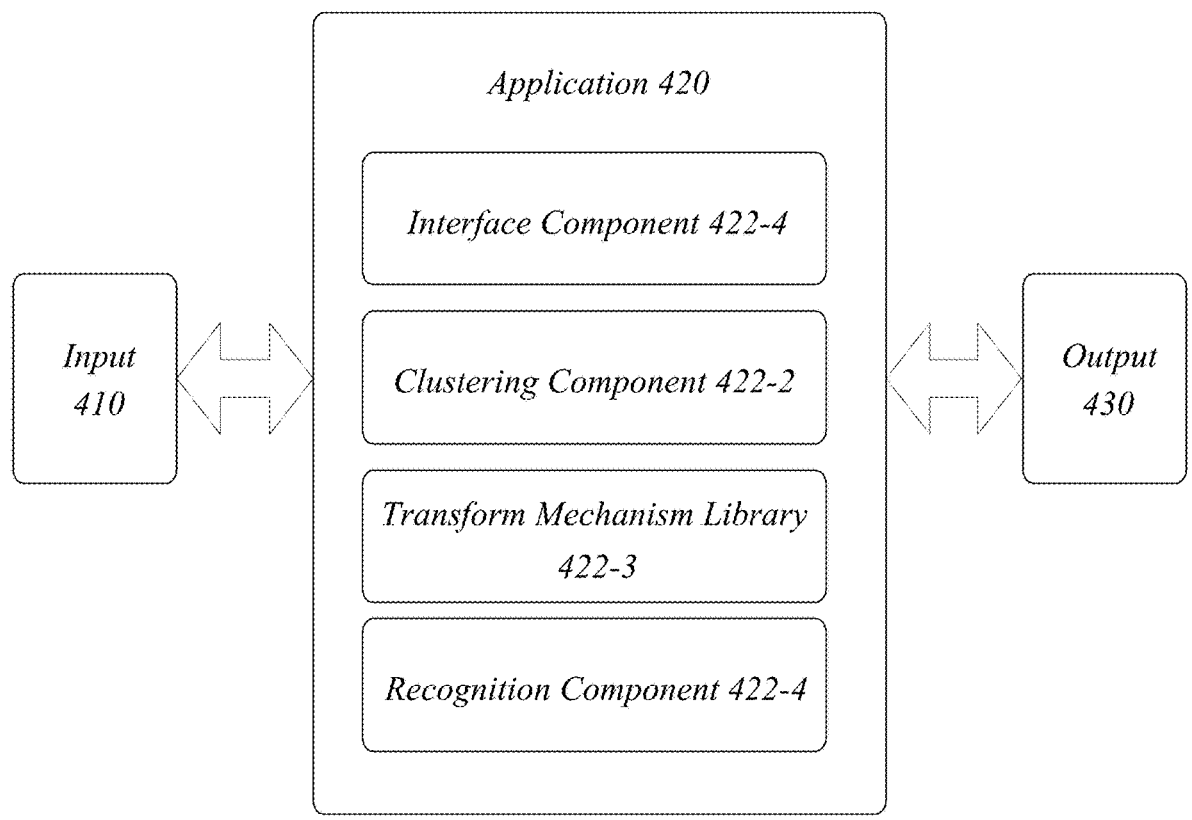
FIG. 4 illustrates an embodiment of an operating environment for the system of FIG. 1A or FIG. 1B in accordance with at least one embodiment of the present disclosure.

FIG. 4 illustrates an embodiment of an operational environment 400 for the system 100. As shown in FIG. 4, the operating environment 400 includes an application 420, such as an enterprise software application, for processing input 410 and generating output 430.

The application 420 comprises one or more components 422-a where a represents any integer number. In one embodiment, the application 420 may comprise an interface component 422-1, a clustering component 422-2, a transform mechanism library 422-3, and a recognition component 422-4. The interface component 422-1 may be generally arranged to manage a user interface for the application 420, for example, by generating graphical data for presentation as a Graphical User Interface (GUI). The interface component 422-1 may generate the GUI to depict various elements, such as dialog boxes, HTML forms having rich text, and/or the like.

The clustering component 422-2 may be generally arranged to organize images into image groups or clusters. Some embodiments of the clustering component 422-2 execute the clustering process 200A of FIG. 2A and/or one or more of the encoding, colorspace conversion operations, and/or decoding operations associated with scheme 200B of FIG. 2B and generates the image group model data 350 of FIG. 3. In various embodiments, the clustering component 422-2 identifies, for each image group, a particular colorspace transform having a higher likelihood than a current colorspace transform of success in edge detection for that group as outlined herein or otherwise suitable and uses that scheme to encode data on one or more physical medium, such as a piece of paper, and using any suitable printing device. In various embodiments, the clustering component 422-2 may perform the above-mentioned clustering process for a variety of edge detection techniques, resulting in sets of image groups where each set of image groups corresponds to a particular technique. Edge detection techniques vary in how boundaries are identified in an image; some techniques detect differences in color whereas other techniques measure another attribute. Some techniques differ with respect to how color differences are even measured. It is possible for one technique to alter certain steps and create multiple techniques.

The colorspace transform library 422-3 includes a plurality of colorspace transform mechanisms and may be generally arranged to provide an encoding and colorspace transform mechanism for application on an image, transforming that image into a transformed image in accordance with a different colorspace model than the image's original colorspace model, resulting in encoded data that is optimal for detection, e.g. encoded multimedia data optimal for detection on a physical medium, such as paper.

As described herein, the colorspace model refers to a technique for modeling an image's color data, such as in RGB or in LAB, or RGB to XYZ, or RGB to XYZ to another XYZ. In general, and as outlined in one or more embodiments herein, the colorspace transform mechanism performs mathematical operations to map a data point within the image's original/current colorspace model into a corresponding datapoint in accordance with the different colorspace model. This may involve converting the datapoint's value(s)—which are in one domain—into corresponding value(s) for the corresponding datapoint. As example, the colorspace transform may convert an RGB pixel having a tuple of RGB values into a LAB pixel having a tuple of LAB values, an RGB pixel having a tuple of RGB values into an XYZ pixel having a tuple of XYZ values, and/or an RGB pixel having a tuple of RGB values into an XYZ pixel having a tuple of XYZ values and again into another XYZ pixel having a tuple of other XYZ values. The pixels associated with the final conversion can define an encoded scheme pursuant to a color distribution, where the encoded scheme may be a scannable image, such as image data printed on paper (or any other suitable physical medium) and corresponding to encoded data.

The recognition component 422-4, such as a suitable scanner, printer and/or camera or application for the same, may be generally arranged to execute an edge detection technique as part of a recognition operation on the transformed image. One example of a well-known recognition operation is Optical Character Recognition (OCR), although any suitable recognition technique may be used. The application 420 invokes the recognition component 422-4 to perform various tasks including scanning an encoded scheme corresponding to data and decoding it. The recognition component 422-4 can be configured to contain a key, e.g. a mathematical equation or equations with specified inputs defining a colorspace conversion, such that it scans relevant colors reflected by a printed scheme of encoded data, e.g. encoded data, where the colors are based on one or more colorspace transformation techniques as outlined herein, where the key defines a final transformation that defines color-channels and a colorspace associated with colors of the scannable image, where color-channels defined by the key each represent at least one bit of encoded data, and where the key can be used to perform the decoding when a scan takes place.

In various embodiments, the recognition component 422-4 can print or provide a schema for printing an image, e.g. image data constituting an encoded representation of data, that contains one or more non-black and non-white colors and one or both of an ultraviolet layer and an infrared layer. The color-channels associated with each non-black and non-white color each can constitute at least one bit of data, and each one of the infrared and ultraviolet layers can each constitute one bit of data. In various embodiments, each one of the non-black and non-white colors are generated by a colorspace transformation mechanism or technique and are scannable by a key associated with the transformation mechanism. In various embodiments, the number of color-channels can be adjusted to be greater than or equal to four color-channels, as the recognition component 422-4 can be adjusted to scan any number of colors, including colors not perceptible to the human eye.

In various embodiments, the non-black and non-white color-channel can be used in conjunction with one or both of the infrared or ultraviolet layers on a scannable image, where each of one of the color-channels, ultraviolet layer(s), and/or infrared layer(s) represent a bit of data and a different manner of encoding data into the image, and as such, eight or more bits of data can be encoded into the image. In various embodiments, the ultraviolet layer may be printed or displayed first in relation to the infrared layers and the various layers associated with non-black and non-white color-channels to take advantage of the ultraviolet layer's properties.

In various embodiments, the image containing all or one of the layers associated with the non-black and non-white color-channel layers, the ultraviolet layers, and the infrared layers can be scanned by the recognition component 422-4 for a verification component, where the recognition component 422-4 may contain or receive a key that is based on an equation related to a colorspace conversion, e.g. Equation 1, where the colorspace conversion reveals the relevant color-channels with associated colors containing the information, in addition to one or more verification bits indicating whether the presence or absence of an ultraviolet and/or infrared layer is indicative of encoded information. Accordingly, the key and/or verification bit provides a manner of decoding information.

In various embodiments, application 420 is configured to contain the key and/or verification bit and provide an output 430 once the scan of the image is verified locally. In various embodiments, the recognition component 422-4 can require an additional verification step of contacting a host system that contains one or more of the functionalities of system 100, to confirm, e.g., by one or more comparison steps, that the key and/or verification bit used by the recognition component 422-4 is accurate. If the key is accurate, and the scan is confirmed by the recognition component 422-4, then the output 430 of application 420 is one or more access, transfer, or receipt of information, including currency, personal, and/or financial information, to another entity.

Figure 5A:
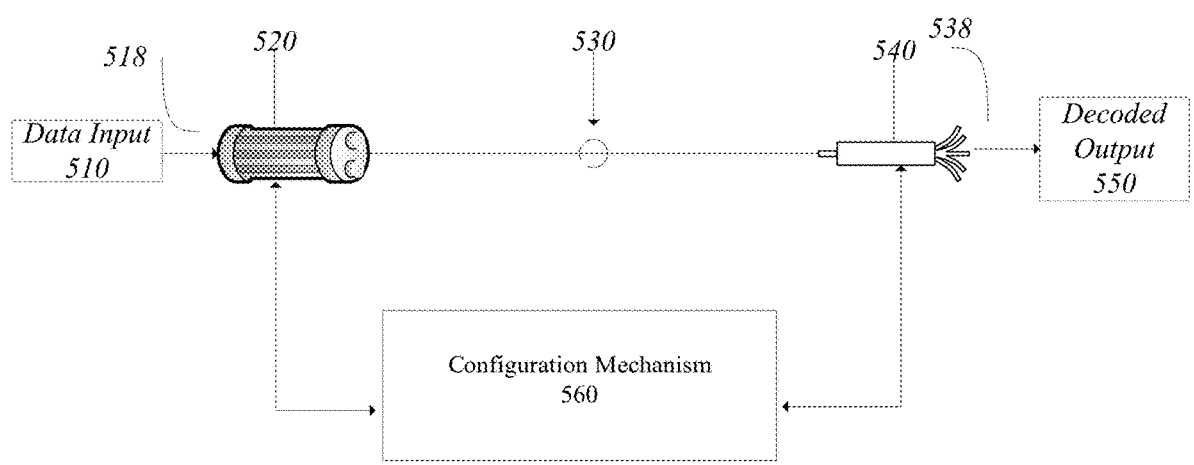
FIG. 5A illustrates an embodiment of a system to encode, transmit, and/or decode data along a transmission medium, and in accordance with at least one embodiment of the present disclosure.

FIG. 5A illustrates an embodiment of a transmission medium system 500A that can be used to transmit encoded data and/or decode encoded data, where in one embodiment the transmission medium system 500A is a fiberoptic system 500A. In various embodiments, the fiberoptic system 500A includes at least two nodes 518 and 538 along a fiberoptic cable or line 530, where one node 518 is associated with at least one fiberoptic transmitter 520 and one node 538 is associated with at least one a fiberoptic receiver 540. The fiberoptic transmitter 520 and the fiberoptic receiver 540 may be controlled or configured by a configuration mechanism 560 that includes one or more components for implementing at least one functionality of system 100A. In various embodiments, the fiberoptic transmitter 520 may also be configured to perform the functionality of a fiberoptic receiver and/or include a fiberoptic receiving device as part of the overall node 518, and in various embodiments the fiberoptic receiver 540 may also be configured to perform the functionality of fiberoptic transmitter and/or include a fiberoptic transmitting device as part of the overall node 538. In various embodiments, the configuration mechanism 560 may be a satellite, server, or any other suitable mechanism that may remotely control a computer device over a wireless network, e.g. internet or intranet, and/or a suitable mechanism that controls the fiberoptic transmitter 520 and fiberoptic receiver 540 via a direct wired connection made by any suitable wired connection, e.g. fiberoptic (a separate fiberoptic connection or as part of cable 530), electrical, etc.

In various embodiments, the fiberoptic transmitter 520 receives a data input 110 at node 518, where the data input may include financial data or information, multimedia data or information, security data or information, or any other data or information that may be suitable for transmission. The data input 110 may be in the form of electrical signals, and the fiberoptic transmitter may detect the electric signals and communicate with the configuration mechanism 560. The configuration mechanism 560 may perform a series of conversion and encryption operations on the data input 110. In various embodiments, the configuration mechanism 560 may perform one or more operations to generate a first colorspace model representing the data input 110, where the first colorspace model may include one or more colors that can be generated and transmitted by the fiberoptic transmitter 520.

In various embodiments, the data input 110 received by the fiberoptic transmitter 520 is in light signal format suitable for transmission along fiberoptic line or cable, e.g. 530, and the fiberoptic transmitter detects the various signals associated with the data input 110 using any number of suitable sensors configured to detect colors associated with those signals. In various embodiments, the configuration mechanism 560 may determine a first colorspace model based on the incoming light signals associated with the incoming data input 110, e.g. if the light signals are one or more of "red," "blue," and "green," signals, then the first colorspace model may be an RGB colorspace model, although this is merely exemplary, and any colors or light channels associated with other models discussed herein may constitute the colors of the incoming light signals of data input 110 and, e.g. LAB, XYZ, etc.

In various embodiments, once the configuration mechanism 560 determines a first colorspace for the data input 110, then it may perform one or more colorspace conversions to encode the data input 110 into encoded data. The colorspace conversions may to establish the encoding may be any suitable colorspace conversions and models as discussed herein. In various embodiments, before or after the configuration mechanism provides a colorspace encoding scheme, it can apply an additional encryption, e.g. a non-color encryption technique such as PGP encryption, to the incoming data input 510, so as to add an additional layer of compression and security to the encoded representation of data input 110. In various embodiments, the key for decrypting the encoded representation of data input 110 may be the mathematical definition defining the second colorspace (or the final colorspace and relevant intermediary colorspaces if multiple conversions are performed), in addition to an appropriate decrypting scheme, key, or information associated with the non-color-based encryption, e.g. PGP encryption, all of which may be transmitted to the fiberoptic receiver 540 so that it may decode a transmission associated with this type of encoding scheme.

In various embodiments, once the configuration mechanism 560 determines the colorspace model and conversions that will govern the transmission, it may instruct the fiberoptic transmitter 520 to transmit light signals pursuant to the color and encoding scheme and transmit such that the generated light signals represent an encoded version of data input 110 and are transmitted through the fiberoptic line 530. In various embodiments, the configuration mechanism 560 may utilize a colorspace transformation that is optimized for detection and transmission based on the sensor and other technical capabilities of the fiberoptic transmitter 520 and fiberoptic receiver 540, e.g. the configuration mechanism 560 will not select colors or associated colorspaces that are associated with colors that cannot be sensed by the fiberoptic receiver 540 and/or generated by the fiberoptic transmitter 520. In various embodiments, a parity check or ECC (e.g. Hamming Code) may be based on a luminance value, e.g. a brightness value associated with the plurality of light signals, the range values of which may also be provided to the fiberoptic receiver 540. In various embodiment, the colorspace encoding may include at least one of i) an infrared channel and ii) an ultraviolet channel, where in various embodiments, either one or both the infrared and/or ultraviolet channel may represent superimposed ultraviolet and/or infrared variations, respectively, from the first-colorspace. In various embodiments, the one or more color channel layers can also be associated with the one or more bits of data related to the Hamming Code or parity check, where in various embodiments, any suitable combination of color-channels, luminance channels, ultraviolet channels, and/or infrared channels can contain any combination of data and/or parity information. In various embodiments, the ECC can be any suitable parity check, such as an odd parity check, even parity check, a parity check based on any factor of "1," any suitable Hamming Code, etc.

In various embodiments, the configuration mechanism 560 may instruct the fiberoptic transmitter 520 to transmit a combined data message, that includes informational data and an ECC, e.g. the configuration mechanism will create two schemes, one that includes a data set and one that includes an ECC data, and the transmitter will combine the scheme to transmit a message that includes light signals representing both the informational data and the ECC, where the ECC can be a Hamming Code. The configuration mechanism 560 can instruct the fiberoptic transmitter 520 to generate one or more light signals associated with one or more color-channels, one or more ultraviolet layers, and one or more infrared layers to construct the data combination. In various embodiments, at least one bit of data and/or ECC portions are represented by any one of the one or more color-channels, one or more ultraviolet layers, one or more infrared layers, and/or one or more luminance channel. In various embodiments, and as alluded to above and below, a defined set of light signals will represent one or more bits of data e.g. if a color associated with a color-channel exceeds a certain value in relation to the range of values of a color-channel, it then can be a "1" and if it is below a certain threshold value in relation to the range of values of that color-channel then the value can be a "0," where the threshold scheme can be used for the data portion and ECC portion of a combined information set, message, or data entity as encoded on through the fiberoptic line 530. In various embodiments, the presence or absence of ultraviolet layer constitutes a bit of data, e.g. a value of "1" if ultraviolet light is carried as part of the light signals representing the data and a value of "0" if it is not carried as part of the light signals constituting the data with respect to either one of the data portion or ECC portion of the message, and similarly the presence or absence of an infrared layers constitutes a bit of data, e.g. a value of "1" if infrared light is carried by the light signals representing the data and a value of "0" if it is not carried with respect to either one of the data portion or ECC portion of the message as printed on the medium. In various embodiments, an intensity level of either or both of the ultraviolet or infrared layers may be used to obtain a value of "1" and/or "0," or a threshold with respect to the ultraviolet or infrared spectrums can be used. In various embodiments, the presence or absence of a luminance layer as carried by the light signals constitutes a bit of data, e.g. a value of "1" if a certain threshold of luminance intensity is exceeded and a "0" if it is below that value.

In various embodiments, the configuration mechanism 560 can create a scheme where a first data set can include any suitable data, e.g. informational, multimedia, etc. and it can be encoded pursuant to a color-channel scheme with at least four-color-channels, where the four-color-channels may or may not be optimized for detection as discussed herein. In various embodiments, the configuration mechanism 560 can create a where a second dataset is representative of an ECC with a bit of ECC data distributed to each one of an ultraviolet channel, an infrared channel and a luminance channel. Accordingly, in various embodiments, a first data set includes four bits of data, with each bit being distributed or represented by a distinct one of the four color-channels, and three bits being represented distinctly by each one of the ultraviolet channel, the ultraviolet channel, and the luminance channel. In various embodiments, variations of the distribution of the first data set and the second data set are represented by any combination of color-channels and luminance, ultraviolet and infrared channels. In various embodiments, in order to preserve data detection, the first data set is encoded along any combination of the four color-channels, the ultraviolet layer, and the infrared layer, with four bits being distributed along those channels and with each channel representing a bit of data. In various embodiments, since the luminance channel is more prone to detectability issues across the transmission medium, to preserve the detectability of the first data, at least one bit of the ECC is carried along the luminance channel and two bits are carried along the remainder of the four color-channels, the ultraviolet layer and the infrared layer that does not carry the first data set. In various embodiments the ECC is encoded along the luminance channel, the ultraviolet channel, and the first data set along the four color-channels. Accordingly, in various embodiments, four bits of data and three bits of ECC are encoded on a combination of at least four color-channels, an infrared channel, an ultraviolet channel, and a luminance channel and for transmission along a transmission medium.

In various embodiments, the configuration mechanism 560 may provide, as stated above, the fiberoptic receiver 540 with the decryption and encoding information required to decrypt the encoded signals traveling down the line, including the mathematical definition governing any colorspace conversions, and by extension, the information required to identify which color-channels contain encoded information, including ultraviolet and infrared channels and in embodiments where an ECC is included, to decode the ECC using any suitable decoding mechanism (e.g. a mechanism that conducts a parity check). In various embodiments, the fiberoptic receiver 540 may activate relevant sensors required to read the relevant color-channels and the configuration mechanism 560 may instruct the receiver 540 to sequence the bits of the color-channel pursuant to a cipher (discussed in greater detail with respect to FIG. 5B) or other suitable mechanism, resulting in decoded output 550. In various embodiments, the decoded output 550 may be provided to any suitable computing device, including being fed back to configuration mechanism 560 for verification and/or for transmission to another node and/or device.

One or more devices at input node 518, node 520, node 540 and output node 538 may, in addition to a relevant fiberoptic transmitter and receiver, include any electronic device capable of receiving, processing, and sending information for the system 100A and/or for configuration mechanism 560. Examples of an electronic device may include without limitation an ultra-mobile device, a mobile device, a personal digital assistant (PDA), a mobile computing device, a smart phone, a telephone, a digital telephone, a cellular telephone, ebook readers, a handset, a one-way pager, a two-way pager, a messaging device, a computer, a personal computer (PC), a desktop computer, a laptop computer, a notebook computer, a netbook computer, a handheld computer, a tablet computer, a server, a server array or server farm, a web server, a network server, an Internet server, a work station, a mini-computer, a main frame computer, a supercomputer, a network appliance, a web appliance, a distributed computing system, multiprocessor systems, processor-based systems, consumer electronics, programmable consumer electronics, game devices, television, digital television, set top box, wireless access point, base station, subscriber station, mobile subscriber center, radio network controller, router, hub, gateway, bridge, switch, machine, or combination thereof. In various embodiments, the above components and/or functions are part of one or more of the configuration mechanism 560 and/or any fiberoptic transmitters and/or receivers at nodes 520 and 540. The embodiments are not limited in this context.

In various embodiments, one or more devices at input node 518, output node 538, node 520, and node 540 may execute instructions, processing operations, or logic for the system 100A using one or more processing components, and in lieu of or in conjunction with configuration mechanism 560 and/or the fiberoptic transmitters and receivers. The processing components at the nodes may comprise various hardware elements, software elements, or a combination of both. Examples of hardware elements may include devices, logic devices, components, processors, microprocessors, circuits, processing circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), Application-specific Standard Products (ASSPs), System-on-a-chip systems (SOCs), Complex Programmable Logic Devices (CPLDs), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. In various embodiments, the above components and/or functions are part of one or more of the configuration mechanism 560 and/or any fiberoptic transmitters and/or receivers at nodes 520 and 540. The embodiments are not limited in this context.

In various embodiments, one or more devices at input node 518 and output node 538, including but not limited to the fiberoptic transmitters and/or receivers and configuration mechanism 560, may execute communications operations or logic for the system 100. The communications components may implement any well-known communications techniques and protocols, such as techniques suitable for use with packet-switched networks (e.g., public networks such as the Internet, private networks such as an enterprise intranet, and so forth), circuit-switched networks (e.g., the public switched telephone network), or a combination of packet-switched networks and circuit-switched networks (with suitable gateways and translators). The communications component 540 may include various types of standard communication elements, such as one or more communications interfaces, network interfaces, network interface cards (NIC), radios, wireless transmitters/receivers (transceivers), wired and/or wireless communication media, physical connectors, and so forth. By way of example, and not limitation, communication media 512 include wired communications media and wireless communications media. Examples of wired communications media may include a wire, cable, metal leads, printed circuit boards (PCB), backplanes, switch fabrics, semiconductor material, twisted-pair wire, co-axial cable, fiber optics, a propagated signal, and so forth. Examples of wireless communications media may include acoustic, radio-frequency (RF) spectrum, infrared and other wireless media.

Figure 5B:
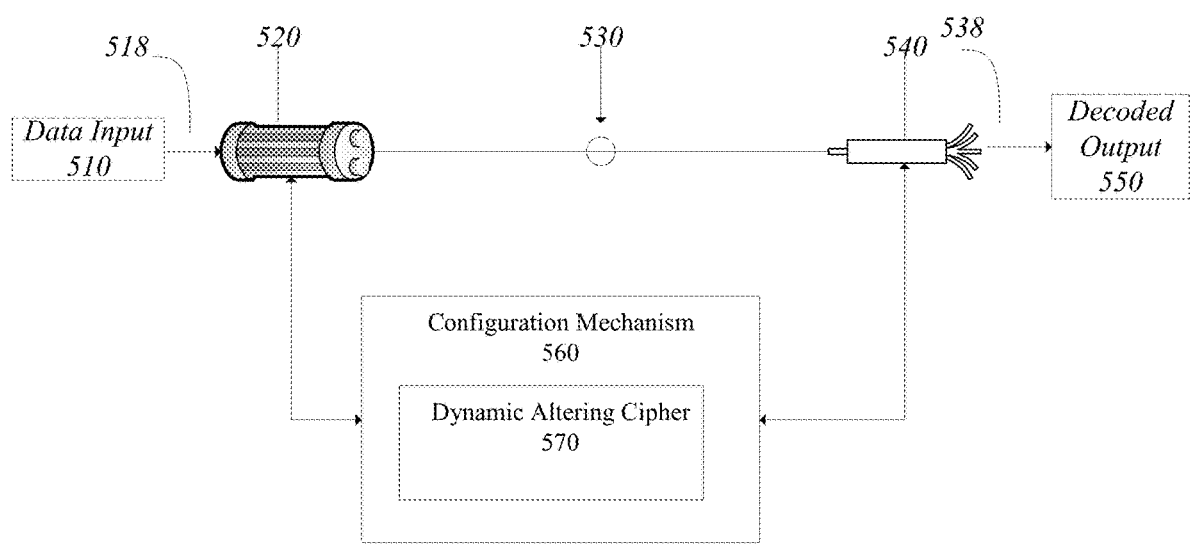
FIG. 5B illustrates an embodiment of a system to encode, transmit, and/or decode data along a transmission medium in accordance with at least one embodiment of the present disclosure.

FIG. 5B illustrates the a fiberoptic transmission medium 500B such as that of FIG. 5A with a dynamic alternating dynamic cipher 570 part of the configuration mechanism 560. The dynamic alternating cypher may be configured to automatically change the colorspace and encoding scheme applied to incoming data input sets 510 based on a time interval, a threshold of an amount of data processed, or any other threshold that may be assessed automatically. The configuration mechanism 560 may then update modifications required to the encoding at the input 510 and relay the update information associated with the cipher 570, including colorspace modifications, to the fiberoptic receiver 540, such that the receiver 540 may decrypt a subsequent transmission based on the modification and/or update producing decrypted 550. The cipher 570 may provide components at nodes 520 and 540, including a fiberoptic transmitter or receiver, with information related to: i) the key defining the one or more colorspace conversions ii) the order or sequencing of information, e.g. color values or range values, of data associated with the color-channels containing an encoded representation of datasets 510, e.g. the bit order or sequencing of the color values of a particular color-channel iii) the order or sequencing of the color-channels containing the encoded representation of datasets 510 with respect to one another, e.g. the bit sequence that bits are to be ordered between and amongst color-channels, iv) the timing at which a sensing or detection should occur based on a timing or processing threshold and/or v) any decryption technique that may be applied to a non-colorspace encryption technique applied to datasets 172, such as PGP encryption.

In various embodiments, the dynamic cipher 570 automatically changes one or more aspects of the encryption associated with a transmission at a node, and the configuration mechanism 560 may update the fiberoptic transmitter may include any modification that changes the relevant information necessary for decryption or decoding (e.g. changing the nature of encoding or encryption) including i) changing which color-channels of a colorspace contain the encoded data, ii) changing the nature, if any, of any superimposition of color-channels from a first colorspace as reflected and/or represented in a second colorspace, iii) changing the range values of one or more color-channels contained or associated with encoded data representing any portion of data input sets 510 by performing a mathematical operation on value ranges of the one or more color-channels, such as an addition, multiplication, division or other suitable operation that would affect the range values defining bit values in that color-channel or color-channels, iv) the timing at which a sensing or detection should occur (based on a timing or processing threshold) and/or v) using a completely different colorspace conversion to represent a first transmitted portion of an encrypted datasets 510, e.g. a portion of datasets 510 are associated and transmitted along line 530 by the transmitter 520 with a colorspace conversion that culminates in one colorspace and, with respect to another portion of datasets 510 as represented by another portion of encoded dataset transmissions along line 530, a subsequent transmission is governed by another colorspace conversion culminating in another and different colorspace.

Accordingly, various embodiments provided for by FIG. 5A and FIG. 5B provide for one or more fiberoptic systems for transmitting, encoding, and decoding data pursuant to one or more colorspace schemes, where various embodiments add a layer of non-colorspace encoding techniques in the encoding of the data, and where various embodiments provide for an alteration of the encoding (and by extension decoding) based on an alternating cipher that adjusts the encoding at the input of the system and the decoding at the output of the system.

Figure 6A:
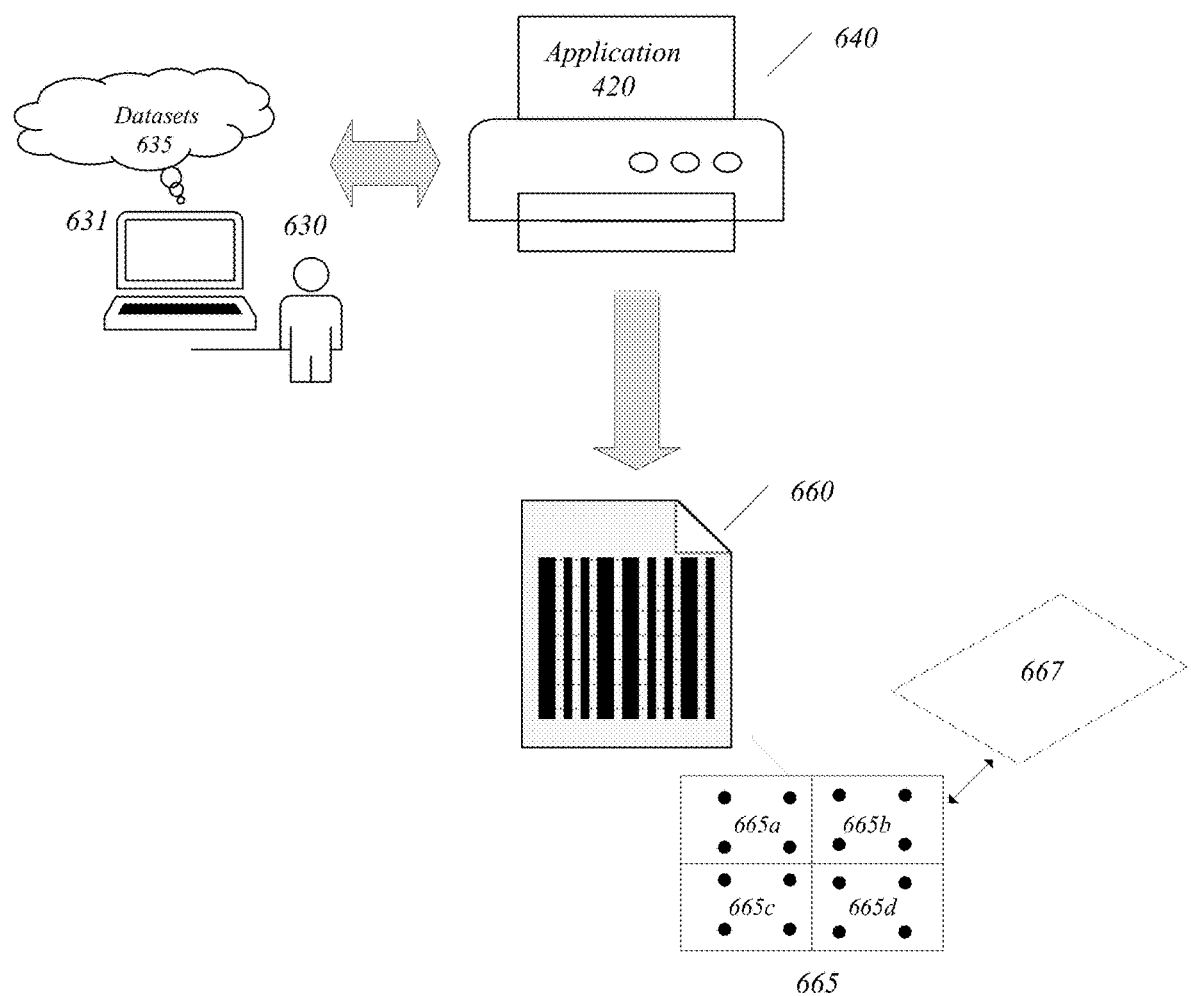
FIG. 6A illustrates an embodiment of a system to encode and print information or data onto one or more physical mediums.

FIG. 6A illustrates a computer, laptop or tablet system 600A for generating and scanning a scannable image. The system 600A may include a computer device 631 that may be instructed by a user 630 to carry out one or more operations. The computer device 631 may include one or more of the components of the system as illustrated in FIG. 1A and/or it may contain one or more of the functions of the application as illustrated in FIG. 4 and/or it may implement one or more of the operations associated with either one or both of logic flow 700 and logic flow 800. In various embodiments, the computer device 631 may contain datasets 635, which may include one or more of image data sets (including but not limited to multimedia data sets), e.g. 635. In various embodiments, the computer device 631 may perform one or more colorspace conversion and encoding techniques on the data associated with datasets 635, as discussed herein or otherwise suitable, and prepare an image scheme representing the encoded data based on the colorspace conversion and encoding techniques, where the encoding may include compressing the data for storage enhancement purposes prior to employing a colorspace encoding scheme.

Alternatively, the image data associated with the encoded data, e.g. patched image data 172 (as shown in FIG. 1A), may be preloaded and part of datasets 635. In various embodiments, the computing device may instruct the printing device 640 to print the encoded multimedia scheme on one or more physical medium, e.g. paper pages 660 and where the printed scheme may include one or more color-channel layers, infrared layers, and/or ultraviolet layers contained data, and/or a luminance channel layer with encoded tangential information, such as metadata, page orientation information, or a parity check (Hamming code). In various embodiments, printing device 640 may be configured to contain and/or execute any applications and/or suitable operations associated with any suitable computer device as described herein, including any relevant colorspace and encoding techniques, and in lieu of being associated or coordinating with another computer device, e.g. 631.

In various embodiments, the computer device 631 can instruct the printer to print a scheme on the physical medium 660 such that the scheme includes an ECC, such as a Hamming Code. In various embodiments, one or more pixels associated with one or more color-channels, one or more ultraviolet layers, one or more infrared layers can be encoded with data (e.g. multimedia data, informational data, etc.) and/or with a portion of the ECC and printed on the physical medium. In various embodiments, at least one bit of data and/or ECC portions are represented by any one of the one or more color-channels, one or more ultraviolet layers, one or more infrared layers, and/or one or more luminance channel. In various embodiments, and as alluded to above and below, a defined area of pixels will represent one or more bits of data, e.g. if a color associated with a color-channel exceeds a certain value in relation to the range of values of a color-channel, it then can be a "1" and if it is below a certain threshold value in relation to the range of values of that color-channel then the value can be a "0," where the threshold scheme can be used for the data portion and ECC portion of a combined information set, message, or data entity as encoded on the printed medium. In various embodiments, the presence or absence of ultraviolet layer constitutes a bit of data, e.g. a value of "1" if ultraviolet light is reflected and a value of "0" if it is absorbed or otherwise not reflected with respect to either one of the data portion or ECC portion of the message, and similarly the presence or absence of an infrared layers constitutes a bit of data, e.g. a value of "1" if infrared light is reflected and a value of "0" if it is absorbed or otherwise not reflected with respect to either one of the data portion or ECC portion of the message as printed on the medium. In various embodiments, an intensity level of either or both of the ultraviolet or infrared layers may be used to obtain a value of "1" and/or "0," or a threshold with respect to the ultraviolet or infrared spectrums can be used. In various embodiments, the presence or absence of a luminance layer constitutes a bit of data, e.g. a value of "1" if a certain threshold of luminance intensity is exceeded and a "0" if it is below that value.

In various embodiments, the one or more color channel layers can also be associated with the one or more bits of data related to the Hamming Code or parity check, where in various embodiments, any suitable combination of color-channels, luminance channels, ultraviolet channels, and/or infrared channels can contain any combination of data and/or parity information. In various embodiments, the ECC can be any suitable parity check, such as an odd parity check, even parity check, a parity check based on any factor of "1," any suitable Hamming Code, etc.

In various embodiments, the computer device 631 can create two data sets and instruct the printing device to print a combination of the two. The first data set can include any suitable data, e.g. informational, multimedia, etc. and it can be encoded pursuant to a color-channel scheme with at least four-color-channels, where the four-color-channels may or may not be optimized for detection as discussed herein. In various embodiments, the second dataset is representative of an ECC with a bit of ECC data distributed to each one of an ultraviolet channel, an infrared channel and a luminance channel. Accordingly, in various embodiments, a first data set includes four bits of data, with each bit being distributed or represented by a distinct one of the four color-channels, and three bits being represented distinctly by each one of the ultraviolet channel, the ultraviolet channel, and the luminance channel. In various embodiments, variations of the distribution of the first data set and the second data set are represented by any combination of color-channels and luminance, ultraviolet and infrared channels. In various embodiments, including at least one bit of the ECC in the luminance channel and the remaining bits of the first data set and second data set in various combinations of the four color-channels, the ultraviolet layer, and the luminance channel increases the overall detectability of the first data set and second data set by ensuring that the first data is contained in color-channels optimized for detection, while also preserving the detectability of the ECC without compensating for data density, as the luminance channel is more easily detectable on a physical medium. In various embodiments, this advantage can be further amplified by having the first data set encoded on each of the at least four color-channels, and the ECC encoded on each of the luminance channel, the ultraviolet channel, and the infrared channel. Accordingly, in various embodiments, four bits of data and three bits of ECC are encoded on a combination of at least four color-channels, an infrared channel, an ultraviolet channel, and a luminance channel.

In various embodiments, the encoding on the physical medium can be in the form of a matrix bar-code. In various embodiments, whether a matrix barcode is employed or not, the encoding on the physical medium can be pursuant to a quad-tree structure 665. As shown, one type of quad-tree structure is shown, with a portion of the quad-tree and four subdivisions 665a, 665b, 665c, and 665d shown as an example. In various embodiments, each section can contain more than one pixel, e.g. four pixels, to represent a single bit of data as part of an overall channel. For example, if a luminance channel 665a is used, which can be prone to detection errors, by having a four by four portion of pixels with respect to the quad-tree representing the particular bit of data, e.g. a bit of ECC, the detection of that particular bit (and all other bits as encoded in the quad-tree) is enhanced. As shown, the other three sections 665b, 665c, and 665d can be data bit containing channels and/or ECC bit containing channels, and can be any one of a color-channel, an ultraviolet channel, or an infrared channel.

In various embodiments, as shown, the luminance channel, ultraviolet channel, and/or infrared channel can be an entire layer 667 that is overlaid an entirety of one or more sections 665a, 665b, 665c, and 665d such that data associated therewith is more easily detected by any suitable scanning or detection mechanism as disclosed herein. In various embodiments, the data associated with the overlaid layer is one or more parity bits, e.g. part of an ECC. In various embodiments, the layer 667 is a luminance channel and it has any suitable brightness value over zero such that it can be detected by a suitable scanning or detecting mechanism as disclosed herein or otherwise suitable. In various embodiments, where the luminance channel 667 extends over multiple sections 665a, 665b, etc. the chance of a successful detection is enhanced because a larger area is available for scan to obtain the data in association therewith.

In various embodiments, the physical medium 660 can be a scannable tag with at least two layers, and with each layers containing at least one bit of data. The first layer can include one or more channels, e.g. color-channels, ultraviolet channels, infrared channels and/or luminance channels that are encoded with informational data, and the second layer can include one or more channels, e.g. color-channels, ultraviolet channels, infrared channels and/or luminance channels that are encoded with ECC data, e.g. Hamming Code bits. Any combination as suitable and/or as discussed herein is possible and as may suitable for a particular application.

Figure 6B:
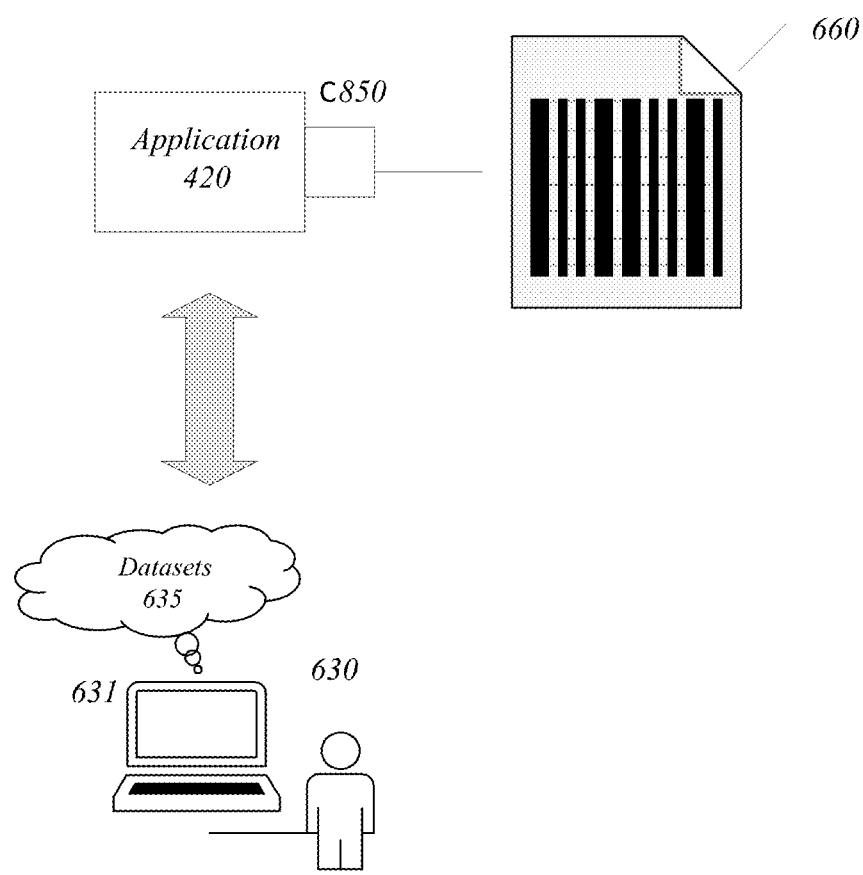
FIG. 6B illustrates an embodiment to decode and print information or data therefrom, and in accordance with at least one embodiment of the present disclosure.

FIG. 6B illustrates a scanning system 600B for scanning the printed pages associated with FIG. 6A. The system 600B may include a computer device 631 that may be instructed by a user 630 to carry out one or more operations. The computer device 631 may include one or more of the components of the system as illustrated in FIG. 1A and/or it may contain one or more of the functions of the application as illustrated in FIG. 4 and/or it may implement one or more of the operations associated with either one or both of logic flow 700 and logic flow 800. In various embodiments, the computer device 631 may contain datasets 635, which may include one or more of image data sets, e.g. 172. In various embodiments, the computer device 631 may instruct scanning device c850 to scan one or more printed pages 660 using any suitable scanning technique, including any suitable edge detection technique as discussed herein. The scanning device may provide the scanned information to the computing device 631, where the computer device may decode the image data obtained from the one or more pages 660 using any suitable decoding technique as discussed herein, and where the printed scheme may include one or more color-channel layers, infrared layers, and/or ultraviolet layers contained data, and/or a luminance channel layer with encoded tangential information, such as metadata, page orientation information, or a parity check (Hamming code). In various embodiments, where a dataset is combined with an ECC, such as a Hamming Code, the decoding can include decoding the ECC using any suitable method and can include performing a parity check. In various embodiments, the decoding may include any decompression techniques required to decompress the data, if it was compressed prior to encoding, and where the decoding and decompression will result in access to the data. Alternatively, the encoded data may be preloaded and part of datasets 635. In various embodiments, scanning device c850 may be configured to contain and/or execute any applications and/or suitable operations associated with the computing device 631, including any relevant decoding operations, in lieu of being associated or coordinating with another computer device, e.g. 631.

Included herein is a set of flow charts representative of exemplary methodologies for performing novel aspects of the disclosed architecture. While, for purposes of simplicity of explanation, the one or more methodologies shown herein, for example, in the form of a flow chart or flow diagram, are shown and described as a series of acts, it is to be understood and appreciated that the methodologies are not limited by the order of acts, as some acts may, in accordance therewith, occur in a different order and/or concurrently with other acts from that shown and described herein. For example, those skilled in the art may understand and appreciate that a methodology could alternatively be represented as a series of interrelated states or events, such as in a state diagram. Moreover, not all acts illustrated in a methodology may be required for a novel implementation.

FIG. 7 illustrates one embodiment of a logic flow 700. The logic flow 700 may be representative of some or all of the operations executed by one or more embodiments described herein.

The logic flow 700 may use any suitable decoding technique to decode a plurality of data associated with a physical medium or transmitted along a transmission medium and according to a colorspace, the colorspace including i) one or more color-channels, ii) one or both of an ultraviolet and an infrared channel, and iii) a luminance channel, where the encoding includes at least one error-correcting-code (ECC) encoded in at least one of i) the one or more color-channels, ii) the ultraviolet or the infrared channel, or iii) the luminance channel, wherein the plurality of data is distinct from the ECC. The data and ECC combination can be pursuant to any combination of color-channels, ultraviolet channels, infrared channels, and luminance channels, including but not limited to express combinations as disclosed herein or otherwise implied 710.

In embodiments where the data and ECC is encoded along a physical medium, the logic flow 700 may instruct a suitable scanner, e.g. scanning device 197, to scan the printed scheme (as contained on any suitable medium, such as a piece of paper) containing encoded data (e.g. video data, audio data, image data, spatial data (which can create three-dimensional renderings), etc.) 602, where the encoded data may have been compressed prior to encoding and where the encoding is pursuant to a colorspace. Any suitable edge detection and/or scanning technique as discussed herein may or otherwise suitable may be used to carry out the scan, including scanning the ECC and decoding it using any suitable technique to perform a parity check.

The logic flow may instruct the suitable scanner, e.g. scanning device 197, and/or a suitable computer system, such as the system illustrated in FIG. 1B of which the scanning device 197 is a part thereof, to decode the compressed encoded data 604. In various embodiments, the scanning device 197 and/or associated computer system in communication therewith, may have a suitable key, e.g., tristimulus equations associated with a conversion to an XYZ colorspace, that reveals the color-channels with associated colors that are associated with the scannable portions of the encoded scheme that contains information, including, in various embodiments, where the key includes the bit configuration for the ECC, thus enabling the parity check to be performed.

In various embodiments, the printed scheme may include four, six, or eight or more distinct colors each associated with at least four, six, or eight distinct color-channels, where each of the colors is different from one another and different from the most prevalent colors of the environment where a scan of the encoded scheme may take place. In various embodiments, the scanning device 197 may be configured to determine a color value of a color associated with color-channels defining the colorspace containing the encoded multimedia scheme, and if it meets a certain threshold, a bit value of the associated color-channel may be either a "1" or a "0." In various embodiments, the scanner may be configured with a verification instruction that an ultraviolet layer and/or infrared layer contains encoded information, and if ultraviolet and/or infrared light is reflected at a threshold level, then a bit value of "1" may be ascribed to either one or both of the ultraviolet and/or infrared channels, and if there the infrared and/or ultraviolet light reflects at a threshold below the threshold level, e.g. in the instance where no ultraviolet and/or infrared ink is used at all and this is intended to convey information, a "0" will be ascribed to that channel of information. In various embodiments, this may result in six bits of data associated with distinct and different color-channels and one bit of data associated with an infrared layer and/or ultraviolet layer, for a total of eight pits of data for a defined area on the physical page. Irrespective of the number of color-channels and/or infrared and/or ultraviolet layers, the scanning device 197 (in conjunction with a suitable computing device) may decode the information associated therewith, as outlined herein, and apply any suitable decompression technique corresponding to the compression technique (if applicable) used to compress the data prior to encoding, in order to obtain data encoded by the printed scheme. Similarly, the scanner can be provided with the channels associated with the ECC bits, e.g. Hamming Code bits, and scan those pursuant to the threshold or presence operations discussed above to determine whether a "0" or "1" is present with respect to a particular channel and execute a parity check as a result. In various embodiments, the data and ECC combination can be a matrix barcode and/or pursuant to a quad-tree structure as discussed herein.

In various embodiments, the logic flow 700 may instruct a decoding of luminance channel information associated with the physical medium containing the encoded data, where the luminance channel information may contain data tangential to the encode data, such as metadata, page orientation information, and/or a parity check function (Hamming Code, e.g. a bit of the Hamming Code). Any one of these pieces of information may be decoded prior, concurrent with, or after the decoding of the data, in order to ensure that the decoded multimedia information is properly processed and/or correct. For example, seven information channels of one or of color-channels, an ultraviolet channel, and/or an infrared layer may correspond to encoded multimedia information, and an eight bit may correspond to an odd parity check scheme, e.g. a Hamming Code, where a certain threshold of brightness may correspond to one value for the parity bit, e.g. "1," and below that threshold may correspond to another value, e.g. "0," where the parity bit may be used in any suitable manner to ensure the veracity and accuracy of the decoded information.

In various embodiments where the combination of data and ECC is along a transmission line, the logic flow may decrypt the received encrypted signal at a node of the transmission medium, e.g. fiberoptic cable, where the decryption is based on an encryption and decryption cipher, and where decryption utilizes a cipher that includes information required to perform the decryption, including colorspace conversion keys and/or the location of data bits and/or the location of ECC bits (e.g. which channel contains data information and which contains ECC bits). In various embodiments where a colorspace optimization is performed in relation to the encryption, the decryption cipher may include a key that defines the conversion to the respective colorspaces, e.g. including the final-converted-to color-channels encoded with the data bits and can provide the basis for decrypting or decoding the encoded signal. Accordingly, the decryption cipher can include colorspace conversion information, bit location information, and a basis for decrypting channels, e.g. ultraviolet channels, luminance channels, infrared channels, and color-channels, that are associated with an ECC.

The logic flow may store the decoded or decrypted signal or signals in any suitable storage system, computer processor with storage capacity, and/or any other computer device as identified herein or as otherwise may be suitable for the task.

FIG. 8 illustrates one embodiment of a logic flow 800. The logic flow 800 may be representative of some or all of the operations executed by one or more embodiments described herein.

The logic flow 800 may create a dimensional-space (e.g. a colorspace with one or more color-channels, infrared channels, ultraviolet channels, and/or luminance channels) with at least seven channels, the dimensional-space including a colorspace with at least four channels each associated with at least one color, the dimensional-space includes at least three additional channels, each distinct from the four color-channels, wherein the three additional channels include i) an ultraviolet channel, ii) an infrared channel, and iii) a luminance channel 810. Any suitable component or components of one or more systems as described herein can create the dimensional-space, which can then be used as a scheme for encoding and/or decoding data with ECC features on a physical medium and/or encoding, transmitting, and/or decoding data with ECC features across a transmission medium.

The logic flow 800 may encode a distinct portion of a plurality of data in at least one of the at least four color-channels or ii) at least one of the three additional channels 820 using any suitable encoding technique by any suitable component as described herein and in relation to any suitable medium as described herein.

The logic flow 800 may include encoding a distinct portion of an error-correcting-code (ECC) in at least one of the i) at least four color-channels or ii) at least one of the three additional channels 830 using any suitable encoding technique by any suitable component as described herein and in relation to any suitable medium as described herein.

The logic flow 800 may include combine the encoded plurality of data and the ECC to form a data message, packet, and/or scheme with a parity check 830 using any suitable encoding technique by any suitable component as described herein and in relation to any suitable medium as described herein.

In various embodiments, the plurality of data will be associated only with the one or more color-channels and the ECC will be associated only with the ultraviolet channel, infrared channel, and/or luminance channel, e.g. four bits of data are encoded with respect to the four color-channels, where each color-channel represents a bit of data, and three bits of ECC, e.g. a Hamming Code, is represented by the luminance channel, the ultraviolet channel, and the infrared channel, where a single bit of ECC data is represented by each of the luminance channel, the ultraviolet channel, and the infrared channel. In various embodiments, none of the plurality of data is encoded in the luminance channel, with all of the plurality of data is distributed into any combination of the four color-channels, the ultraviolet layer, the infrared layer, and the remaining channels are used for the ECC bits, including the luminance channel. Any suitable combination of data and ECC bits amongst the channels is possible, and can be adjusted depending on the desired application, components to be used, and medium that will be associated with the data and ECC.

Figure 9:
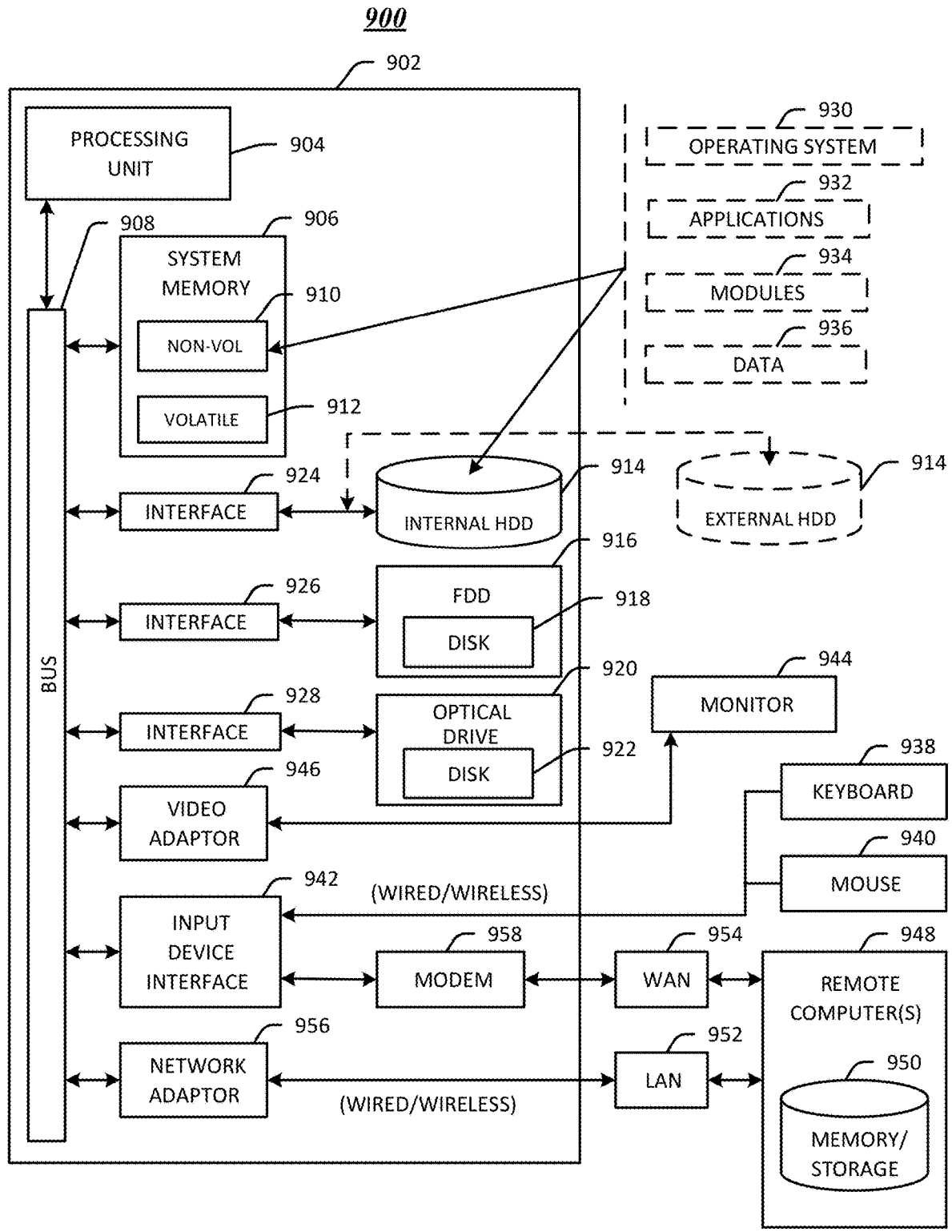
FIG. 9 illustrates an embodiment of a computing architecture.

FIG. 9 illustrates an embodiment of an exemplary computing architecture 900 suitable for implementing various embodiments as previously described. In one embodiment, the computing architecture 900 may comprise or be implemented as part of an electronic device. Examples of an electronic device may include those described with reference to FIG. 3, among others. The embodiments are not limited in this context.

As used in this application, the terms "system" and "component" are intended to refer to a computer-related entity, either hardware, a combination of hardware and software, software, or software in execution, examples of which are provided by the exemplary computing architecture 900. For example, a component can be, but is not limited to being, a process running on a processor, a processor, a hard disk drive, multiple storage drives (of optical and/or magnetic storage medium), an object, an executable, a thread of execution, a program, and/or a computer. By way of illustration, both an application running on a server and the server can be a component. One or more components can reside within a process and/or thread of execution, and a component can be localized on one computer and/or distributed between two or more computers. Further, components may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Exemplary connections include parallel interfaces, serial interfaces, and bus interfaces.

The computing architecture 900 includes various common computing elements, such as one or more processors, multi-core processors, co-processors, memory units, chipsets, controllers, peripherals, interfaces, oscillators, timing devices, video cards, audio cards, multimedia input/output (I/O) components, power supplies, and so forth. The embodiments, however, are not limited to implementation by the computing architecture 900.

As shown in FIG. 9, the computing architecture 900 comprises a processing unit 904, a system memory 906 and a system bus 908. The processing unit 904 can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Celeron®, Core (2) Duo®, Itanium®, Pentium®, Xeon®, and XScale® processors; and similar processors. Dual microprocessors, multi-core processors, and other multiprocessor architectures may also be employed as the processing unit 904.

The system bus 908 provides an interface for system components including, but not limited to, the system memory 906 to the processing unit 904. The system bus 908 can be any of several types of bus structure that may further interconnect to a memory bus (with or without a memory controller), a peripheral bus, and a local bus using any of a variety of commercially available bus architectures. Interface adapters may connect to the system bus 908 via a slot architecture. Example slot architectures may include without limitation Accelerated Graphics Port (AGP), Card Bus, (Extended) Industry Standard Architecture ((E)ISA), Micro Channel Architecture (MCA), NuBus, Peripheral Component Interconnect (Extended) (PCI(X)), PCI Express, Personal Computer Memory Card International Association (PCMCIA), and the like.

The computing architecture 900 may comprise or implement various articles of manufacture. An article of manufacture may comprise a computer-readable storage medium to store logic. Examples of a computer-readable storage medium may include any tangible media capable of storing electronic data, including volatile memory or non-volatile memory, removable or non-removable memory, erasable or non-erasable memory, writeable or re-writeable memory, and so forth. Examples of logic may include executable computer program instructions implemented using any suitable type of code, such as source code, compiled code, interpreted code, executable code, static code, dynamic code, object-oriented code, visual code, and the like. Embodiments may also be at least partly implemented as instructions contained in or on a non-transitory computer-readable medium, which may be read and executed by one or more processors to enable performance of the operations described herein.

The system memory 906 may include various types of computer-readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory, solid state drives (SSD) and any other type of storage media suitable for storing information. In the illustrated embodiment shown in FIG. 9, the system memory 906 can include non-volatile memory 910 and/or volatile memory 912. A basic input/output system (BIOS) can be stored in the non-volatile memory 910.

The computer 902 may include various types of computer-readable storage media in the form of one or more lower speed memory units, including an internal (or external) hard disk drive (HDD) 914, a magnetic floppy disk drive (FDD) 916 to read from or write to a removable magnetic disk 918, and an optical disk drive 920 to read from or write to a removable optical disk 922 (e.g., a CD-ROM or DVD). The HDD 914, FDD 916 and optical disk drive 920 can be connected to the system bus 908 by an HDD interface 924, an FDD interface 926 and an optical drive interface 928, respectively. The HDD interface 924 for external drive implementations can include at least one or both of Universal Serial Bus (USB) and IEEE 1394 interface technologies.

The drives and associated computer-readable media provide volatile and/or nonvolatile storage of data, data structures, computer-executable instructions, and so forth. For example, a number of program modules can be stored in the drives and memory units 910, 912, including an operating system 930, one or more application programs 932, other program modules 934, and program data 936. In one embodiment, the one or more application programs 932, other program modules 934, and program data 936 can include, for example, the various applications and/or components of the system 100.

A user can enter commands and information into the computer 902 through one or more wire/wireless input devices, for example, a keyboard 938 and a pointing device, such as a mouse 940. Other input devices may include microphones, infra-red (IR) remote controls, radio-frequency (RF) remote controls, game pads, stylus pens, card readers, dongles, finger print readers, gloves, graphics tablets, joysticks, keyboards, retina readers, touch screens (e.g., capacitive, resistive, etc.), trackballs, trackpads, sensors, styluses, and the like. These and other input devices are often connected to the processing unit 904 through an input device interface 942 that is coupled to the system bus 908 but can be connected by other interfaces such as a parallel port, IEEE 1394 serial port, a game port, a USB port, an IR interface, and so forth.

A monitor 944 or other type of display device is also connected to the system bus 908 via an interface, such as a video adaptor 946. The monitor 944 may be internal or external to the computer 902. In addition to the monitor 944, a computer typically includes other peripheral output devices, such as speakers, printers, and so forth.

The computer 902 may operate in a networked environment using logical connections via wire and/or wireless communications to one or more remote computers, such as a remote computer 948. The remote computer 948 can be a workstation, a server computer, a router, a personal computer, portable computer, microprocessor-based entertainment appliance, a peer device or other common network node, and typically includes many or all of the elements described relative to the computer 902, although, for purposes of brevity, only a memory/storage device 950 is illustrated. The logical connections depicted include wire/wireless connectivity to a local area network (LAN) 952 and/or larger networks, for example, a wide area network (WAN) 954. Such LAN and WAN networking environments are commonplace in offices and companies, and facilitate enterprise-wide computer networks, such as intranets, all of which may connect to a global communications network, for example, the Internet.

When used in a LAN networking environment, the computer 902 is connected to the LAN 952 through a wire and/or wireless communication network interface or adaptor 956. The adaptor 956 can facilitate wire and/or wireless communications to the LAN 952, which may also include a wireless access point disposed thereon for communicating with the wireless functionality of the adaptor 956.

When used in a WAN networking environment, the computer 902 can include a modem 958, or is connected to a communications server on the WAN 954 or has other means for establishing communications over the WAN 954, such as by way of the Internet. The modem 958, which can be internal or external and a wire and/or wireless device, connects to the system bus 908 via the input device interface 942. In a networked environment, program modules depicted relative to the computer 902, or portions thereof, can be stored in the remote memory/storage device 950. It may be appreciated that the network connections shown are exemplary and other means of establishing a communications link between the computers can be used.

The computer 902 is operable to communicate with wire and wireless devices or entities using the IEEE 802 family of standards, such as wireless devices operatively disposed in wireless communication (e.g., IEEE 802.11 over-the-air modulation techniques). This includes at least Wi-Fi (or Wireless Fidelity), WiMax, and Bluetooth™ wireless technologies, among others. Thus, the communication can be a predefined structure as with a conventional network or simply an ad hoc communication between at least two devices. Wi-Fi networks use radio technologies called IEEE 802.11x (a, b, g, n, etc.) to provide secure, reliable, fast wireless connectivity. A Wi-Fi network can be used to connect computers to each other, to the Internet, and to wire networks (which use IEEE 802.3-related media and functions).

Figure 10:
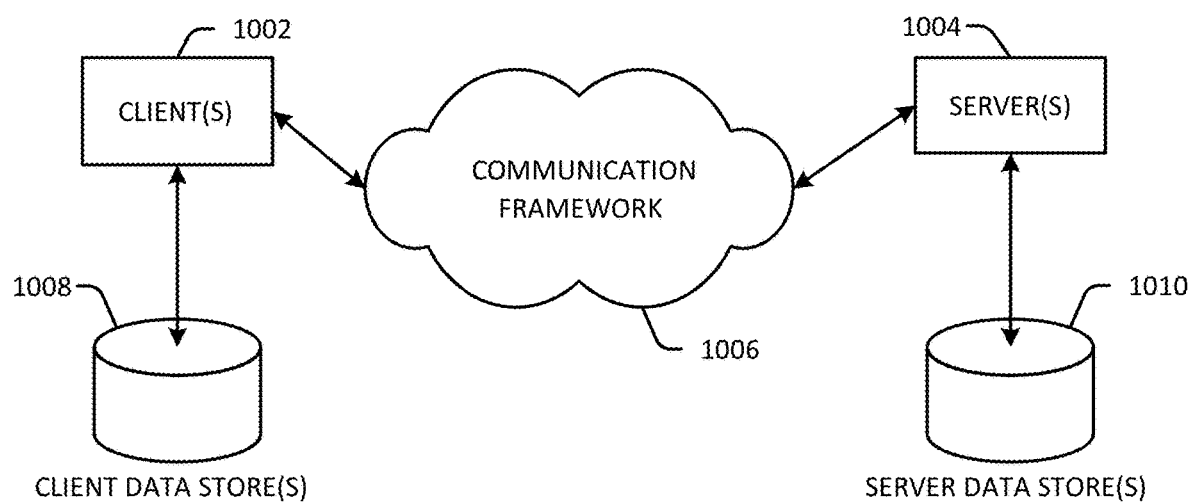
FIG. 10 illustrates an embodiment of a communications architecture.

FIG. 10 illustrates a block diagram of an exemplary communications architecture 1000 suitable for implementing various embodiments as previously described. The communications architecture 1000 includes various common communications elements, such as a transmitter, receiver, transceiver, radio, network interface, baseband processor, antenna, amplifiers, filters, power supplies, and so forth. The embodiments, however, are not limited to implementation by the communications architecture 1000.

As shown in FIG. 10, the communications architecture 1000 comprises includes one or more clients 1002 and servers 1004. The clients 1002 may implement the client device 310. The servers 1004 may implement the server device 950. The clients 1002 and the servers 1004 are operatively connected to one or more respective client data stores 1008 and server data stores 1010 that can be employed to store information local to the respective clients 1002 and servers 1004, such as cookies and/or associated contextual information.

The clients 1002 and the servers 1004 may communicate information between each other using a communication framework 1006. The communications framework 1006 may implement any well-known communications techniques and protocols. The communications framework 1006 may be implemented as a packet-switched network (e.g., public networks such as the Internet, private networks such as an enterprise intranet, and so forth), a circuit-switched network (e.g., the public switched telephone network), or a combination of a packet-switched network and a circuit-switched network (with suitable gateways and translators).

The communications framework 1006 may implement various network interfaces arranged to accept, communicate, and connect to a communications network. A network interface may be regarded as a specialized form of an input output interface. Network interfaces may employ connection protocols including without limitation direct connect, Ethernet (e.g., thick, thin, twisted pair 10/100/1000 Base T, and the like), token ring, wireless network interfaces, cellular network interfaces, IEEE 802.11a-x network interfaces, IEEE 802.16 network interfaces, IEEE 802.20 network interfaces, and the like. Further, multiple network interfaces may be used to engage with various communications network types. For example, multiple network interfaces may be employed to allow for the communication over broadcast, multicast, and unicast networks. Should processing requirements dictate a greater amount speed and capacity, distributed network controller architectures may similarly be employed to pool, load balance, and otherwise increase the communicative bandwidth required by clients 1002 and the servers 1004. A communications network may be any one and the combination of wired and/or wireless networks including without limitation a direct interconnection, a secured custom connection, a private network (e.g., an enterprise intranet), a public network (e.g., the Internet), a Personal Area Network (PAN), a Local Area Network (LAN), a Metropolitan Area Network (MAN), an Operating Missions as Nodes on the Internet (OMNI), a Wide Area Network (WAN), a wireless network, a cellular network, and other communications networks.

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" in various places in the specification are not necessarily all referring to the same embodiment. Further, some embodiments may be described using the expression "coupled" and "connected" along with their derivatives. These terms are not necessarily intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to allow a reader to quickly ascertain the nature of the technical disclosure. It is submitted with the understanding that it may not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations that fall within the spirit and scope of the appended claims.

The invention claimed is:

1. An apparatus, comprising:
a memory to store instructions; and
processing circuitry, coupled with the memory, operable to execute the instructions, that when executed, cause the processing circuitry to:
encode, according to a colorspace, a data and at least one error-correcting code (ECC) on a physical medium or along a transmission medium, wherein the colorspace comprises at least four color channels, wherein the at least four color channels includes only the encoded data, and wherein the at least one ECC is encoded in each of: an ultraviolet channel of the colorspace, an infrared channel of the colorspace, and a luminance channel of the colorspace.

2. The apparatus of claim 1, wherein the encoding is on the physical medium pursuant to a quad-tree structure.

3. The apparatus of claim 1, wherein the encoding is along the transmission medium.

4. The apparatus of claim 1, wherein the physical medium is a tag, wherein the color channels are part of at least two layers on the tag, wherein a first layer of the at least two layers is associated with the data, and wherein a second layer of the at least two layers is associated with the ECC.

5. A method, comprising:
decoding, according to a colorspace, a data and at least one error-correcting code (ECC) encoded on a physical medium or received on a transmission medium, wherein the colorspace comprises at least four color channels, wherein the at least four color channels includes only the encoded data, and wherein the at least one ECC is encoded in each of: an ultraviolet channel of the colorspace, an infrared channel of the colorspace, and a luminance channel of the colorspace.

6. The method of claim 5, wherein the data is encoded on the physical medium, wherein the method further comprises:
scanning the physical medium prior to the decoding.

7. The method of claim 5, wherein the encoding is on the physical medium pursuant to a quad-tree structure.

8. The method of claim 5, wherein the data is received on the transmission medium.

9. The method of claim 5, wherein the physical medium is a tag, wherein the color channels are part of at least two layers on the tag, wherein a first layer of the at least two layers is associated with the data, and wherein a second layer of the at least two layers is associated with the ECC.

10. A non-transitory computer-readable storage medium storing instructions that when executed by a processor cause the processor to:
encode, according to a colorspace, a data and at least one error-correcting code (ECC) on a physical medium or along a transmission medium, wherein the colorspace comprises at least four color channels, wherein the at least four color channels includes only the encoded data, and wherein the at least one ECC is encoded in each of: an ultraviolet channel of the colorspace, an infrared channel of the colorspace, and a luminance channel of the colorspace.

11. The computer-readable storage medium of claim 10, wherein the encoding is on the physical medium pursuant to a quad-tree structure.

12. The computer-readable storage medium of claim 10, wherein the encoding is along the transmission medium.

13. The method of claim 5, wherein the at least one ECC is pursuant to a Hamming code scheme.

14. The method of claim 5, wherein the encoding is along the transmission medium, wherein the data comprises at least four bits of data and the at least one ECC comprises at least three bits of ECC.

15. The apparatus of claim 1, the processing circuitry operable to execute the instructions, that when executed, cause the processing circuitry to:
instruct a printing device to print the encoded data and the at least one ECC on the physical medium.

16. The apparatus of claim 1, wherein the at least one ECC is pursuant to a Hamming code scheme.

17. The apparatus of claim 1, wherein the encoding is along the transmission medium, wherein the data comprises at least four bits of data and the at least one ECC comprises at least three bits of ECC.

18. The computer-readable storage medium of claim 10, wherein the at least one ECC is pursuant to a Hamming code scheme.

19. The computer-readable storage medium of claim 10, wherein the encoding is along the transmission medium, wherein the data comprises at least four bits of data and the at least one ECC comprises at least three bits of ECC.

20. The computer-readable storage medium of claim 10, wherein the physical medium is a tag, wherein the color channels are part of at least two layers on the tag, wherein a first layer of the at least two layers is associated with the data, and wherein a second layer of the at least two layers is associated with the ECC.

* * * * *